(12) United States Patent
Wood

(10) Patent No.: US 6,525,618 B2
(45) Date of Patent: Feb. 25, 2003

(54) ELECTRONIC CIRCUITRY

(75) Inventor: John Wood, Raunds (GB)

(73) Assignee: Multigig Limited, Wilby (GB)

( * ) Notice: Subject to any disclaimer, the term of this patent is extended or adjusted under 35 U.S.C. 154(b) by 0 days.

(21) Appl. No.: 10/167,639

(22) Filed: Jun. 12, 2002

(65) Prior Publication Data

US 2002/0196089 A1 Dec. 26, 2002

Related U.S. Application Data

(62) Division of application No. 09/529,076, filed as application No. PCT/GB00/00175 on Jan. 24, 2000.

(30) Foreign Application Priority Data

| Jan. 22, 1999 | (GB) | 9901359 |
| Jan. 25, 1999 | (GB) | 9901618 |
| Jan. 30, 1999 | (GB) | 9902001 |

(51) Int. Cl.[7] .............. H03B 5/18; H03B 5/24
(52) U.S. Cl. .............. 331/57; 331/96; 331/99
(58) Field of Search .............. 331/57, 96, 99, 331/100

(56) References Cited

FOREIGN PATENT DOCUMENTS

| EP | 0 633 662 A1 | * | 1/1995 |
| GB | 2358563 A | * | 7/2001 |
| WO | 00144093 | * | 7/2000 |

\* cited by examiner

*Primary Examiner*—David C. Mis
(74) *Attorney, Agent, or Firm*—Chapman and Cutler

(57) ABSTRACT

Electronic circuitry having two circuitry parts each having timing signal generating and distribution means using signal path provisions exhibiting endless electromagnetic continuity affording signal phase inversion with associated regenerative active means so as to serve as source of said timing signals, further comprises inter-connection between the signal path provisions of each of the circuitry parts over an electrical length and at positions of the signal path provisions to coordinate mutual frequency and phase coherence of the circuitry parts, and bidirectional data transfer means at each circuitry part further coordinated with the coordinated timing signals.

48 Claims, 29 Drawing Sheets

ELECTRONIC CIRCUITRY

This application is a division of application Ser. No. 09/529,076. Application Ser. No. 09/529,076, originally filed on Apr. 6, 2000, as the national stage of PCT/GB00/00175, are hereby incorporated herein by reference.

FIELD OF INVENTION

The invention relates to electronic circuitry for data communication or transfer in conjunction with use of timing signals which are conveniently, indeed preferably, generally as in co-pending patent application Ser. No. 09/529,076 from which this application is divided.

BACKGROUND TO INVENTION

Application Ser. No. GB00/04891 includes the broad concept and realisation of method and means for effectively integrating or synergistically combining distribution of repeating pulse or cyclic signals with active means for producing and maintaining those signals. A composite electromagnetic/semiconductor structure is facilitated that simultaneously generates and distributes timing signals, including a master clock. A suitable said signal path exhibits endless electromagnetic continuity affording signal phase inversion of an electromagnetic wave type signal, conveniently with path-associated regenerative means.

In inventively related rationale, time constant for repeating pulse or cyclic signals is related to and effectively defined by electrical length of said signal path in the signal distribution means. A travelling electromagnetic wave recirculating in endlessly electromagnetically continuous said signal path is preferred, when its traverse time of the signal path determines said time constant.

Moreover, this has capability for direct production of pulse-like cyclic signals inherently having fast rise and fall characteristics, i.e. already "square" as produced, rather than requiring resort to "squaring" action on a basic inherently substantially sinusoidal signal as hitherto conventional. Indeed, such electrical length/signal traverse time-constant-defining rationale leads conveniently and advantageously to said electrical length or one said signal traverse effectively first defining one unipolar half-cycle signal excursion and next, or at next said signal traverse, effectively completing definition of a full bipolar cycle comprising two opposite half-cycle excursions. Said electrical length thus corresponds to 180-degrees for each of two successive pulse excursions for such full bipolar cycle.

Specifically, signals of a travelling wave nature use a said signal distribution path having a suitably propagating nature therefor, typically of endless transmission-line form, further with transposing effect and inverting action associated with re-circulations of desired signals.

Desired repeating cyclic signals involve re-circulatory travelling wave propagation means effectively affording rotation thereabout by a desired travelling wave and setting duration of each signal excursion, with active regenerative means that can be of switching and amplifying nature, conveniently bidirectional inverting amplifier, supplying energy requirements and setting relatively short rise and fall at ends of each signal excursion.

Suitable travelling wave propagation means with desired transposing effect relative to active inverting means is exemplified, as seen by the traversing travelling wave, by physical width twisted along its length to connect opposite sides to input and output of the inverting means, say as though a Moebius band or ribbon.

Planar implementation of travelling wave propagation means can have typical transmission-line form using spaced path-following conducting features, with aforesaid Moebius twist effect afforded by a mutually insulated cross-over of those spaced conducting features. An alternative would be use of a transmission-line inverting transformer in or associated with otherwise transmission-line form of the travelling propagation means.

Exemplary implementation uses spaced conductive features as trace formations each having substantially the same length and being transposed on the way between output and input of at least one inverter feature connected to, preferably between, those conductive traces. In practice, at least where the inverter feature is of extent less than about 1% along the conductive features, there will preferably be plural inverter features spaced along the conductive features or traces.

Preferred inverter means is of bidirectional nature, such as a pair of opposite inverters side-by-side or back-to-back; and such provision facilitates direct simultaneous production of similar or substantially identical anti-phase cyclic signal components.

Such timing signal provision has low power consumption that can effectively be limited to transmission-line and inverter action losses, i.e. to near-negligible topping-up via the inverter provision(s), and take-off to operational circuitry which is readily made, e.g. by way of light bidirectional connection paths of passive resistive and/or capacitive and/or inductive or transmission-line nature, or unidirectional say using diodes or inverters.

Also, at least in principle and absent fabrication imperfections, cyclic signal provision hereof has no innate preference for either direction or rotation of travelling wave propagation, though either may be predisposed or imposed by such as prescribed spacings or other differences between or within inverter means.

Practical pulse generators and oscillators as such include transmission-line structures using conductive metal and insulating dielectric layers in a manner compatible with IC production generally and particularly together with regenerative circuitry associated with the transmission-line as such, typically and conveniently formed below and connected by vias; required insulated cross-overs or spaced transmission-line transformer parts are likewise readily formed including such as via jump connections for the cross-overs; and resulting advantageously DC unstable interconnection of terminals of such as bidirectional inverters as the regenerative means; synchronous detection and bridge rectifier action of preferred bidirectional inverters; reinforcing sequential action of such bidirectional inverters including recycling electrical energy relative to supplies; etc.

Moreover, interconnection/intercoupling of timing signal generating and distribution circuitry is readily achieved, whether by direct connection or by sharing magnetic and/or electrical fields; and on a self-synchronising basis with extension to different frequencies particularly in odd-harmonic relationship.

SUMMARY OF INVENTION

Such intercoupling and coordinating of timing provisions within and between ICs can have particular relevance to the present invention in achieving transfer of data, including between circuitry parts that are not necessarily ICs, for which aspects and features arise later in this Description, and/or are as set out in independent and dependent Claims, wording of which is to be taken as incorporated here too.

BRIEF DESCRIPTION OF DRAWINGS

Specific exemplary implementation for the invention is now described and shown by reference to the accompanying diagrammatic drawings, in which

FIGS. 7(i)–7(ix) are idealised graphs illustrating the phase of timing signal waveforms;

FIG. 14b is on an equivalent circuit diagram for FIG. 14a;

FIG. 18 is a diagrammatic equivalent representation for FIG. 13a;

FIGS. 34b–34e concern data latches for the system of FIG. 34a.

DETAILED DESCRIPTION FOR ILLUSTRATED EMBODIMENTS

Known transmission-lines broadly fall into two categories in that they are either open-ended or specifically terminated either partially or fully. Transmission-lines as proposed in GB00/04891 are different in being neither terminated nor open-ended. They are not even unterminated as such term might be understood hitherto; and actually and effectively afford a signal path exhibiting endless electromagnetic continuity.

Figure 1:
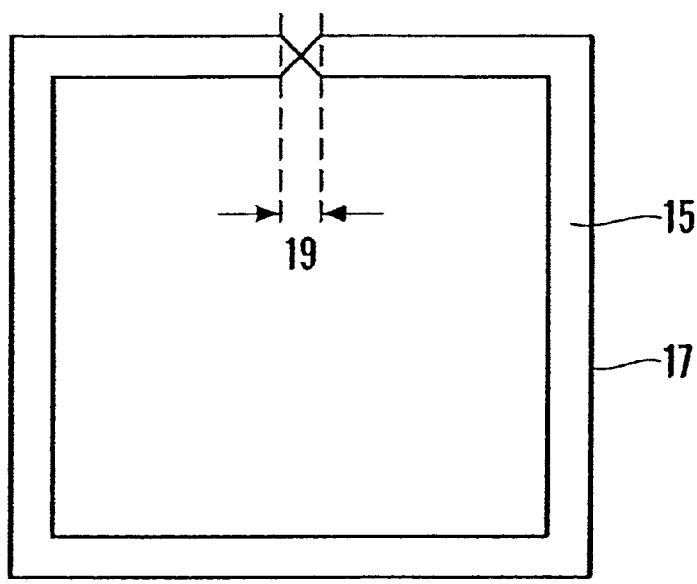
FIG. 1 is an outline diagram for a transmission-line structure of GB/00/04891.

FIG. 1 shows such a transmission-line 15 as a structure that is further seen as physically endless, specifically comprising a single continuous "originating" conductor formation 17 shown forming two appropriately spaced generally parallel traces as loops 15a, 15b with a cross-over at 19 that does not involve any local electrical connection of the conductor 17. The length of the originating conductor 17, taken as S, and corresponds to two 'laps' of the transmission-line 15 as defined between the spaced loop traces 15a, 15b and through the cross-over 19.

Figure 2:
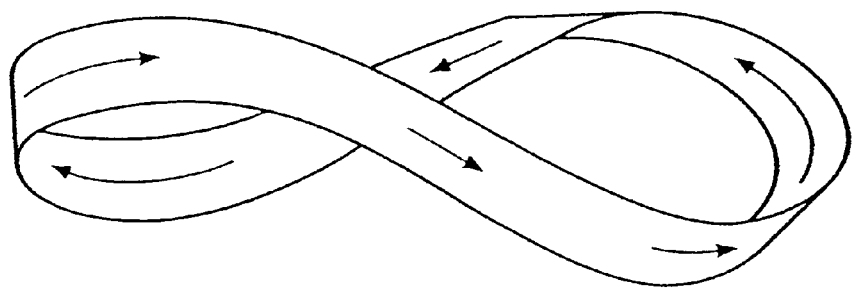
FIG. 2 shows a Moebius strip.

This structure of the transmission-line 15 has a planar equivalence to a Moebius strip, see FIG. 2, where an endless strip with a single twist through 180° has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e. with graduality of twist that could be advantageous compared with planar equivalent cross-over 19. A flexible printed circuit board so formed and with its ICs mounted is seen as a feasible proposition.

Figure 3:
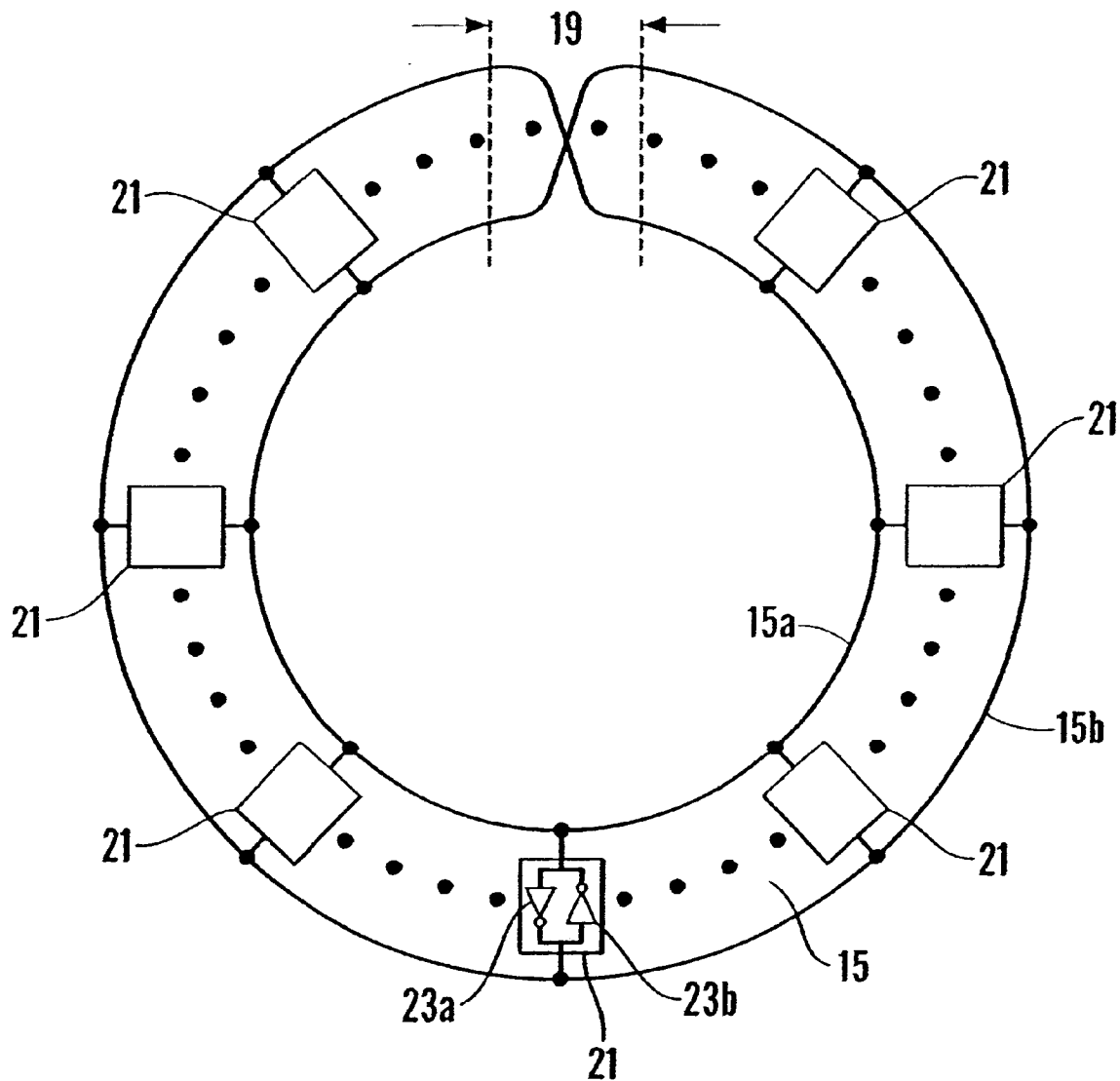
FIG. 3 is an outline circuit diagram for a travelling wave oscillator.

FIG. 3 is a circuit diagram for a pulse generator, actually an oscillator, using the transmission-line 15 of FIG. 1, specifically further having plural spaced regenerative active means conveniently as bidirectional inverting switching/amplifying circuitry 21 connected between the conductive loop traces 15a, 15b. The circuitry 21 is further illustrated in this particular embodiment as comprising two inverters 23a, 23b that are connected back-to-back. Alternative regenerative means could rely on negative resistance, negative capacitance or be otherwise suitably non-linear, and regenerative (such as Gunn diodes). It is preferred that the circuitry 21 is plural and distributed along the transmission-line 15, further preferably evenly, or substantially evenly; also in large numbers say up to 100 or more, further preferably as many and each as small as reasonably practical.

Inverters 23a, 23b of each switching amplifier 21 will have the usual operative connections to relatively positive and negative supply rails, usually V+ and GND, respectively. Respective input/output terminals of each circuit 21 are shown connected to the transmission-line 15 between the loops 15a, 15b at substantially maximum spacing apart along the effectively single conductor 17, thus each at substantially halfway around the transmission-line 15 relative to the other.

Figure 4:
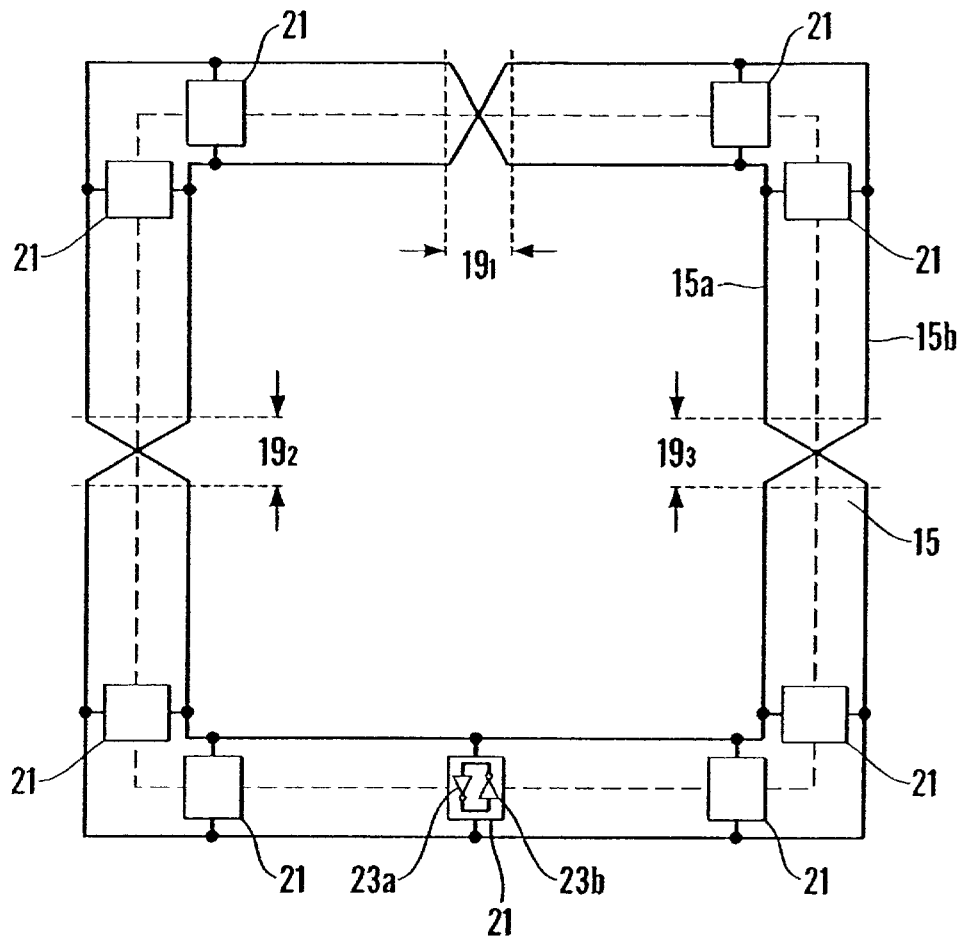
FIG. 4 is another outline circuit diagram for a travelling wave oscillator.

FIG. 4 is another circuit diagram for an oscillator using a transmission-line structure hereof, but with three cross-overs 19a, 19b and 19c, thus the same Moebius strip-like reversing/inverting/transposing property as applies in FIG. 3.

The rectangular and circular shapes shown for the transmission-line 15 are for connvenience of illustration. They can be any shape, including geometrically irregular, so long as they have a length appropriate to the desired operating frequency, i.e. so that a signal leaving an amplifier 21 arrives back inverted after a full 'lap' of the transmission-line 15, i.e. effectively the spacing between the loops 15a,b plus the crossover 19, traversed in a time Tp effectively defining a pulse width or half-cycle oscillation time of the operating frequency.

Advantages of evenly distributing the amplifiers 21 along the transmission-line 15 are twofold. Firstly, spreading stray capacitance effectively lumped at associated amplifiers 21 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 15 better to compensate for losses associated with the transmission-lines dielectric and conductor materials. A continuous closed-loop transmission-line 15 with regenerative switching means 21 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2*pi*SQRT(Le*Ce))$ that is greater than the self-sustaining oscillating frequency F (F3, F5 etc.) of the transmission-line 15.

Figure 5A:
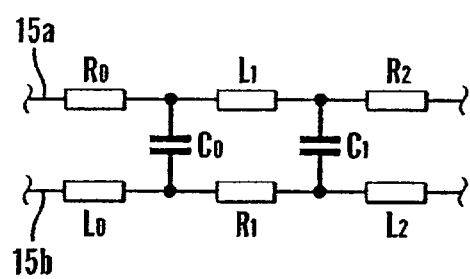
FIGS. 5a and 5b are equivalent circuits for distributed electrical models of a portion of a transmission-line.

FIG. 5a is a distributed electrical equivalent circuit or model of a portion of a transmission-line 15 hereof. It shows alternate distributed resistive (R) and inductive (L) elements connected in series, i.e. $R_0$ connected in series with $L_1$ in turn connected in series with $R_2$ and so on for a portion of loop 15a, and registering $L_0$ connected in series with $R_1$ in turn connected in series with $L_2$ and so on for the adjacent portion of loop 15b; and distributed capacitive elements $C_0$ and $C_1$ shown connected in parallel across the transmission-line 15 thus to the loops 15a and 15b between the resistive/inductive elements $R_0/L_1$ and the inductive/resistive elements $L_0/R_1$, respectively for $C_0$, and between the inductive/resistive elements $L_1/R_2$ and the resistive/inductive elements $R_1/L_2$, respectively for $C_1$: where the identities R0=R1=R2, L1=L2=L3 and C0=C1 substantially hold and the illustrated distributed RLC model extends over the whole length of the transmission-line 15. Although not shown, there will actually be a parasitic resistive element in parallel with each capacitive element C, specifically its dielectric material.

Figure 5B:
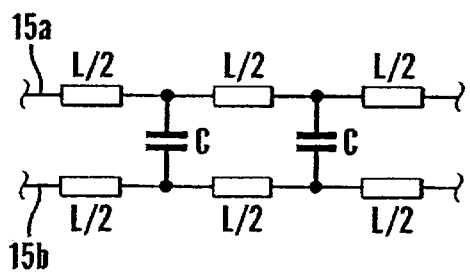

FIG. 5b is a further simplified alternative distributed electrical equivalent circuit or model that ignores resistance, see replacement of those of FIG. 5a by further distribution of inductive elements in series at half (L/2) their value (L) in FIG. 5a. This model is useful for understanding basic principles of operation of transmission-lines.

During a 'start-up' phase, i.e. after power is first applied to the amplifiers 21, oscillation will get initiated from amplification of inherent noise within the amplifiers 21, thus begin substantially chaotically though it will quickly settle to oscillation at a fundamental frequency F, typically within nano-seconds. For each amplifier 21, respective signals from its inverters 23a and 23b arrive back inverted after experiencing a propagation delay Tp around the transmission-line 15. This propagation delay Tp is a function of the inductive and capacitive parameters of the transmission-line 15; which, as expressed in henrys per metre (L) and in farads per metre (C) to include all capacitive loading of the transmission-line, lead to a characteristic impedance Zo=SQR (L/C) and a line traverse or propagation or phase velocity Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2·Tp), for which the sub-divisor condition is satisfied. All other integer multiples of this frequency also satisfy this sub-divisor condition, but gain of the amplifiers 21 'falls off', i.e. decreases, for higher frequencies, so the transmission-line 15 will quickly settle to fundamental oscillation at the frequency F.

The transmission-line 15 has endless electromagnetic continuity, which, along with fast switching times of preferred transistors in the inverters 23a and 23b, leads to a strongly square wave-form containing odd harmonics of the fundamental frequency F in effectively reinforced oscillation. At the fundamental oscillating frequency F, including the odd harmonic frequencies, the terminals of the amplifiers 21 appear substantially unloaded, due to the transmission-line 15 being 'closed-loop' without any form of termination, which results very desirably in low power dissipation and low drive requirements. The inductance and capacitance per unit length of the transmission-line 15 can be altered independently, as can also be desirable and advantageous.

Figure 6A:
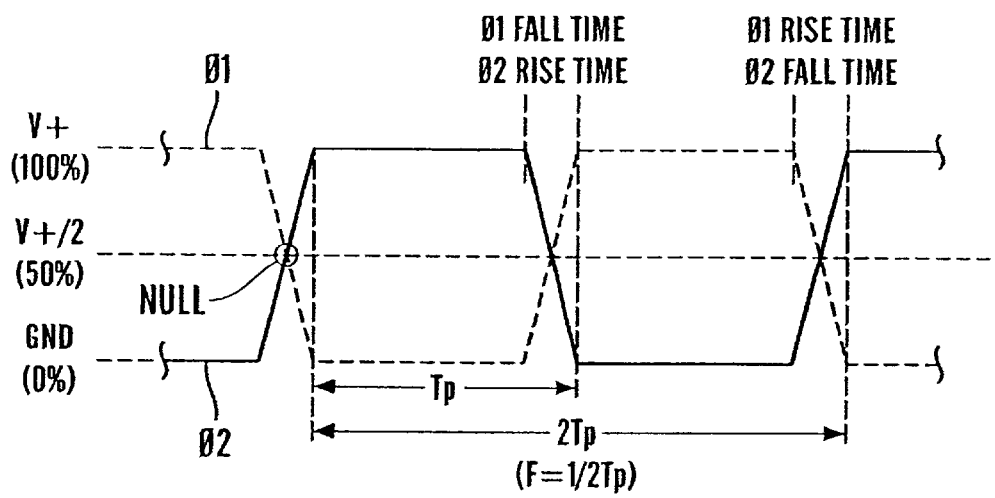
FIG. 6a shows idealised graphs for respective differential output waveforms.

FIG. 6a shows idealised waveforms for a switching amplifier 21 with inverters 23a and 23b. Component oscillation waveforms $\Phi1$, $\Phi2$ appear at the input/output terminals of that amplifier 21 shortly after the 'start-up' phase, and continue during normal operation. These waveforms $\Phi1$ and $\Phi2$ are substantially square and differential, i.e. two-phase inverse in being 180 degrees out-of-phase. These differential waveforms $\Phi1$ and $\Phi2$ cross substantially at the mid-point (V+/2) of the maximum signal amplitude (V+). This mid point (V+/2) can be considered as a 'null' point since the instant that both the waveforms $\Phi1$ and $\Phi2$ are at the same potential, there is no displacement current flow present in nor any differential voltage between the conductive loop traces 15a and 15b. For the preferred recirculating travelling wave operation, this null point effectively sweeps round the transmission line 15 with very fast rise and fall times and a very 'clean' square-wave form definition. This null point is also effectively a reference voltage for opposite excursions of a full cycle bipolar clock signal.

Figure 6B:
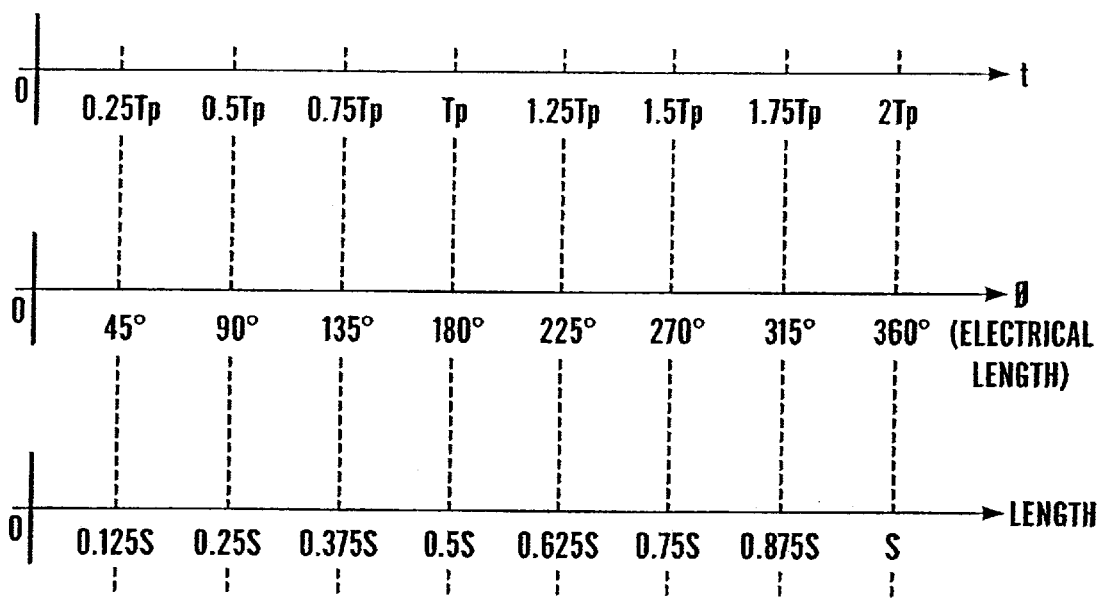
FIG. 6b illustrates relationship between propagation delay, electrical length and physical length of a transmission-line.

For the transmission-line 15, it is convenient to consider complete laps as traversed by a travelling wave, and also total length S of the originating conductive trace 17, both in terms of 'electrical length'. FIG. 6*b* shows relationships between the propagation delay or traverse time (Tp), electrical length in degrees, and physical length (S) of originating conductive line/trace 17. For each of the out-of-phase waveforms Φ1 and Φ2, and as seen by a travelling wave repeatedly traversing the transmission-line 15, each substantially square wave excursion corresponds to one complete lap, i.e. one traverse time Tp, and successive opposite wave excursions require two consecutive laps, i.e. two traverse times (2×Tp). One lap of the transmission-line 15 thus has an 'electrical length' of 180 degrees, and two laps are required for a full 0°–360° bipolar signal cycle, i.e. corresponding to the full lengths of the originating conductor 17.

By way of example, an electrical length of 180° corresponding to one lap and ½ wavelength at 1 GHz could be formed from a 45 mm transmission-line having a phase velocity (Pv) that is 30% that of the speed of light (c), i.e. Pv=0.3*c, or 4.5 mm where Pv=0.03*c, or 166 mm in free space, i.e. where Pv=1*c.

Figure 7:
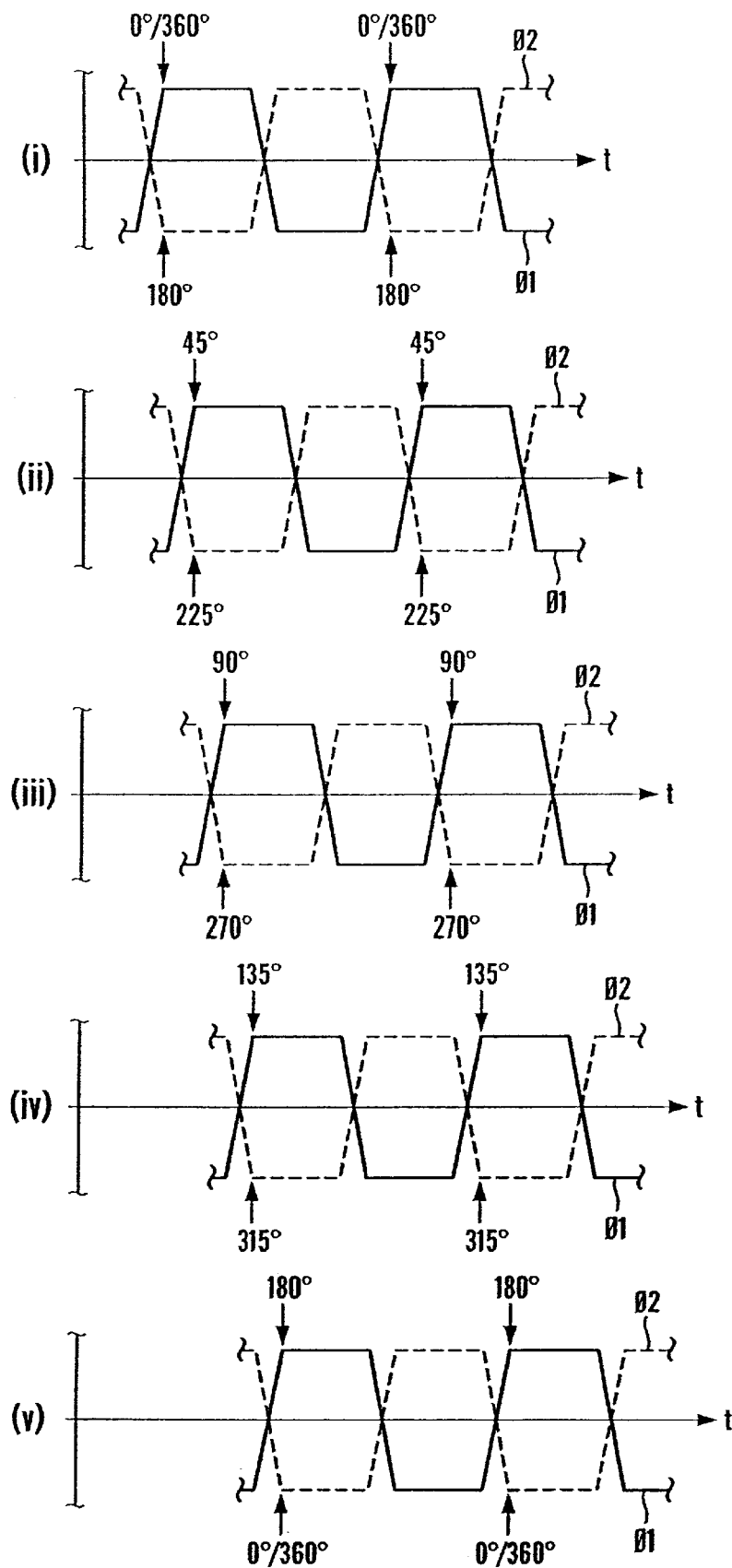
Figure 7:
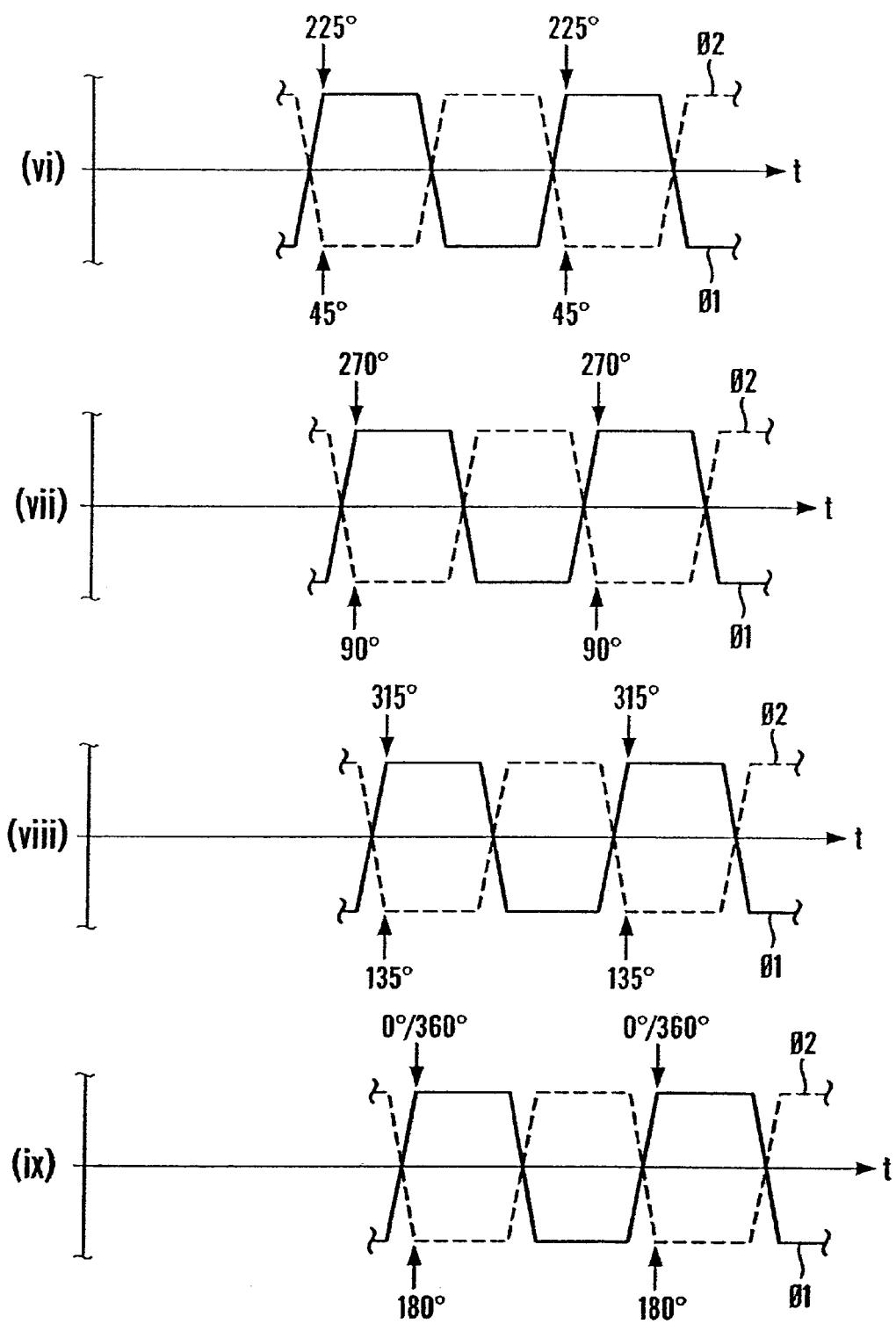

FIGS. 7(*i*)–7(*ix*) show waveforms Φ1, and Φ2 through a full cycle to start of the next cycle, specifically at eight equal electrical-length spacings of 45 degrees between sample positions along the conductor line or trace 17. Phase labellings are relative to FIG. 7(*i*) which can be anywhere along the trace 17, i.e. twice round the transmission line 15, as such, and 0/360-degrees for rise/fall of the Φ1, Φ2 waveforms 15 is arbitrarily marked. Taking FIG. 7(*i*) as time t0, FIG. 7(*ii*) shows the waveforms Φ1 and Φ2 at time t0+(0.25Tp) after one-eighth (0.125S) traverse of total length S of the line 17, thus traverse of one-quarter of the transmission line 15, and 45-degrees of electrical length. Times t0+(0.5Tp), t0+(0.75Tp), t0+(0.75Tp) . . . t0+(2Tp); traverses 0.25S, 0.375S, 0.5S . . . 1.0S and 90, 135, 180 . . . 360-degrees should readily be seen self-evidently to apply to FIGS. 7(*iii*)–(*ix*), respectively.

Figure 8A:
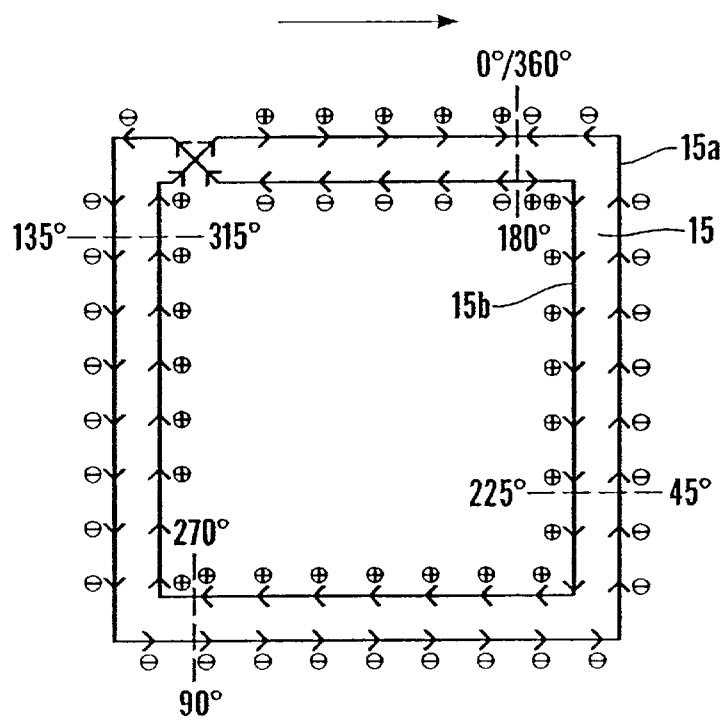
FIGS. 8a, 8b illustrate instantaneous phasing of one waveform in a transmission-line oscillator hereof.
Figure 8B:
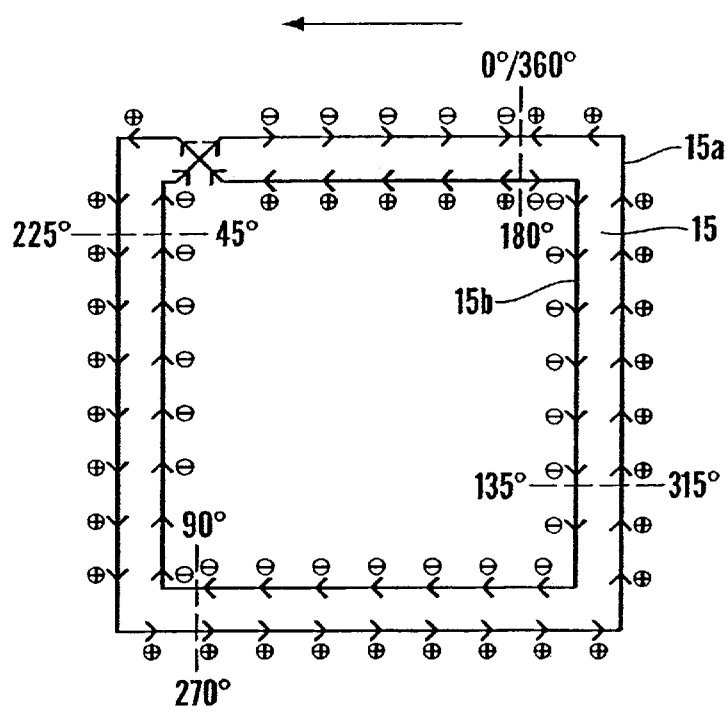

FIGS. 8*a* and 8*b* show snap-shots of excursion polarity (shown circled), displacement current flow (shown by light on-trace arrows), and instantaneous phasing from an arbitrary 0/360-degree position on the electromagnetically endless transmission line 15 covering two laps thereof (thus the full length the continuous originating conductor 17). Only one differential travelling electromagnetic (EM) waveform (Φ1) of FIG. 7 is shown, but for rotation propagation around the transmission-line 15 in either of opposite directions, i.e. clockwise or counter-clockwise. The other waveform (Φ)2) will, of course be 180° out of phase with the illustrated waveform (Φ1). The actual direction of rotation of the EM wave will be given by Poyntings' vector, i.e. the cross product of the electric and magnetic vectors. The crossover region 19 produces no significant perturbation of the signals Φ1 or Φ2 as the EM wave traverses this region 19. In effect, the fast rise/fall transitions travel round the transmission-line at phase velocity Pv, the switching amplifiers 21 serving to amplify the transitions during first switching between supply voltage levels.

The phases of the waveforms Φ1 and Φ2 can, for a transmission-line 15, be accurately determined from any arbitrary reference point on the transmission-line 15, thus have strong coherence and stability of phasing.

Suitable (indeed preferred in relation to present IC manufacturing technology and practice) switching amplifiers 21 for bidirectional operation are based on back-to-back Mosfet inverters 23*a,b*, for which up to well over 1,000 switching inverting amplifier pairs could be provided along typical lengths of transmission-line structures hereof.

The bidirectional inverting action of the switching amplifiers 21 is of synchronous rectification nature. The rise and fall times of the waveforms Φ1 and Φ2 are very fast indeed compared with hitherto conventional timing signals, being based on electron-transit-time of preferred Mosfet transistors of the inverters 23*a,b*. Moreover, reinforcement is related to the transmission-line 15 having lower impedance than any 'on' transistor in inverters of preferred bidirectional switching amplifiers 21, though total paralleled is usefully of the same order. Switching of such inverters means that each amplifier 21 contributes to the resulting wave polarity by way of a small energy pulse which, by symmetry, must propagate in both directions, the forwardly directed EM wave pulse thus contributing as desired. The reverse EM wave pulse that travels back to the previously switched amplifier 21 is of the same polarity as already exists there, thus reinforces the pre-existing switched state. Ohmic paths between power supply rails and the transmission line 15 through 'on' transistors of the preferred inverters of amplifiers 21 ensure that energy of such reverse EM wave pulses is absorbed into those power supply rails V+,GND, i.e. there is useful power conservation.

It should be appreciated that implementation could be by other than CMOS, e.g. by using N-channel pull-ups, P-channel pull-downs, bipolar transistors, negative resistance devices such as Gunn diodes, Mesfet, etc Regarding the transmission-lines 15 as such, a suitable medium readily applicable to ICs and PCBs and interconnects generally is as commonly referred to as microstrip or coplanar waveguide or stripline, and well known to be formable lithographically, i.e. by patterning of resists and etching. Practical dielectrics for an on-IC transmission-line include silicon dioxide ($SiO_2$m) often referred to as field oxide, inter-metal dielectrics, and substrate dielectrics (which can be used at least for semi-insulating structures, e.g. of silicon-on-insulator type).

Figure 9:
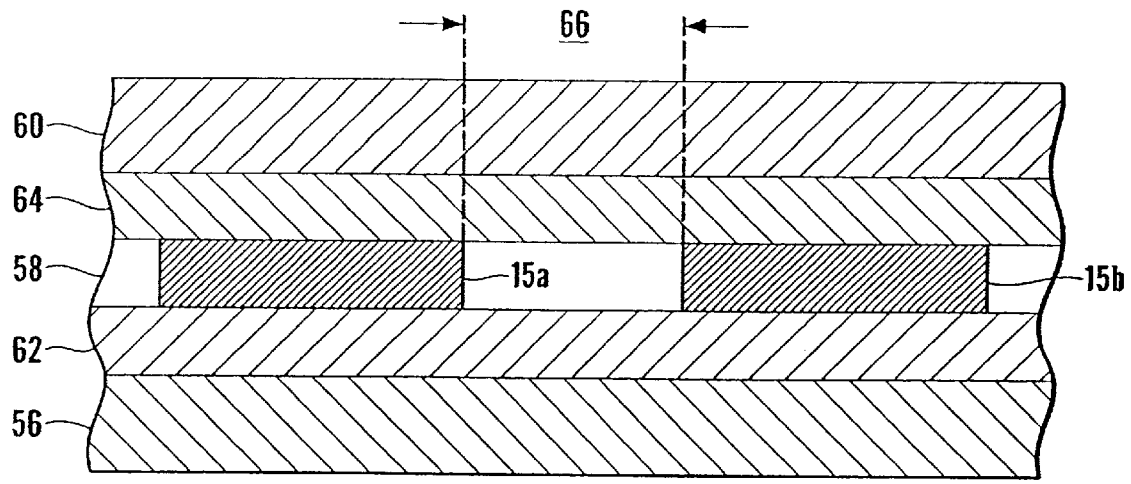
FIG. 9 is a cross sectional view of part of a transmission-line on an IC.

FIG. 9 is a cross-section through a portion of one exemplary on-IC transmission-line formation comprising three metal layers 56, 58 and 60 and two dielectric layers 62 and 64. Middle metal layer 58 is illustrated as comprising the two transmission-line loop conductive traces 15*a* and 15*b* that are at least nominally parallel. Upper metal layer 60 could be used as an AC 'ground' plane and could be connected to the positive supply voltage V+, lower metal 56 being a 'ground' plane that could be connected to the negative supply voltage GND. The dielectric layers 62 and 64 between the metal transmission-line traces at 58 and 'ground' planes 56 and 58 are typically formed using silicon dioxide ($SiO2$). The full illustrated structure is seen as preferable, though maybe not essential in practice, i.e. as to inclusion of either or both of the 'ground' planes and the dielectric layers 62, 64. The physical spacing 66 between the conductive traces 15*a*, 15*b* affects the differential and common modes of signal propagation, which should preferably have equal, or substantially equal, velocities in order to achieve minimum dispersion of the electromagnetic field from the spacing 66. Screening properties improve with use of 'ground planes', as does the ability for the structure to drive non-symmetrical, i.e. unbalanced, loads applied to the conductive traces 15*a*, 15*b*.

Inter-metal dielectric layers on a typical IC CMOS process are thin, typically about 0.7 μm, so microstrip transmission-line features with low signal losses must have a low characteristic impedance Zo (as hitherto for unterminated, partially terminated or series terminated lines acting to reduce signal reflections to a manageable level). Self-sustaining, non-terminated, closed-loop transmission-lines 15 hereof inherently have very low power consumption for maintained travelling EM wave oscillation as the dielectric and conductor losses to be overcome are typically low. From FIG. 5b, it will be appreciated that, if there were no resistive losses associated with the transmission-line 15 and amplifiers 21, the transmission-line 15 would require no more energy than required initially to 'charge-up' the transmission-lines inductive Le and capacitive Ce elements. The EM wave would continually travel around the transmission-line with all energy in the transmission-line 15 simply transferred, or recycled between its electric and magnetic fields, thus capacitive Ce and inductive Le elements. Whilst there must be some resistive losses associated with the transmission-line 15 and amplifiers 21, see transmission-line resistive elements $R_0$–$R_2$ in FIG. 5a, the resistance is typically low and associated resistive losses will be also low. There is no penalty herein from for using low-impedance transmission-lines 15, even advantage from being less affected by capacitive loading, thus resulting in 'stiffer' drive to logic gates.

A crossover 19 can be implemented on an IC using 'vias' between the metal layers, preferably with each via only a small fraction of total length S of the transmission-line 15.

Figure 10A:
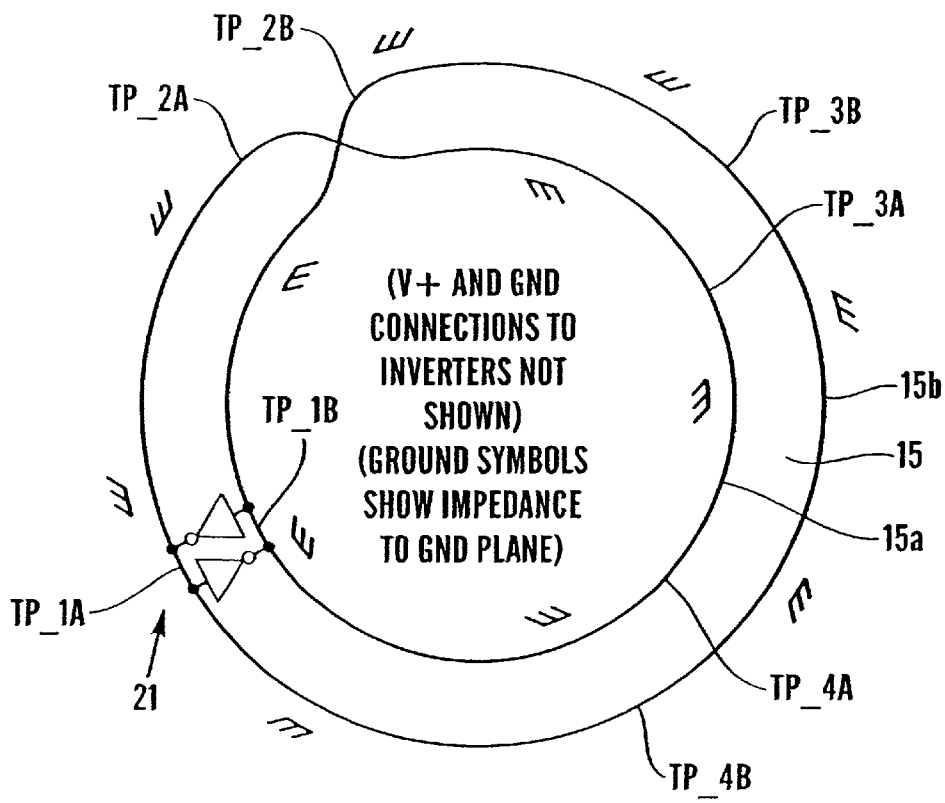
FIGS. 10a and 10b are outline circuit and idealised graphs for a standing wave version.
Figure 10B:
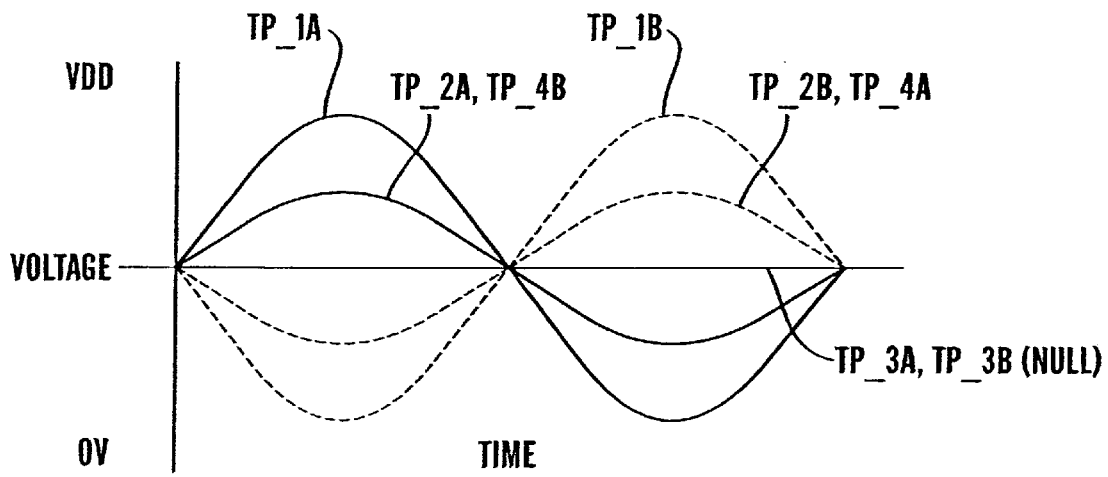

A variant is available where a transmission-line 15 hereof has only one amplifier 21 connected to the transmission-line, and the EM wave no longer travels around the transmission-line 15 so that a standing wave oscillation results, see FIG. 10a for single amplifier 21 and FIG. 10b for differential waveforms. Such amplifier should not extend over more than approximately 5° of the electrical length of the transmission-line 15. If the single amplifier 21 never goes fully 'on' or 'off' a standing sine wave oscillation will result in the transmission-line 15, which will have varying amplitude with the same phases at the same positions including two stationary, two null regions.

It follows that travelling wave operation will be available using a few spaced or just one lengthy CMOS bidirectional inverter formation, though plural small inverters will produce smoother faster results. Offsetting formations of the amplifiers 21, even just its input/output terminals, can predispose a travelling EM wave to one direction of transmission-line traversal, as could specific starter circuit such as based on forcing first and slightly later second pulses onto the transmission-line at different positions, or incorporation of some known microwave directional coupler.

Figure 11:
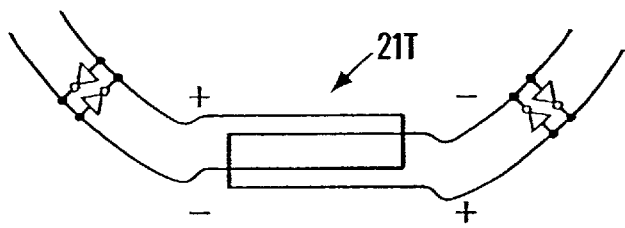
FIG. 11 is a scrap outline of a transmission-line with inverting transformer.

Inverting transmission-line transformers can be used instead of the crossovers (19) and still yield a transmission line having endless electromagnetic continuity, see FIG. 11 for scrap detail at 21T.

Figure 12:
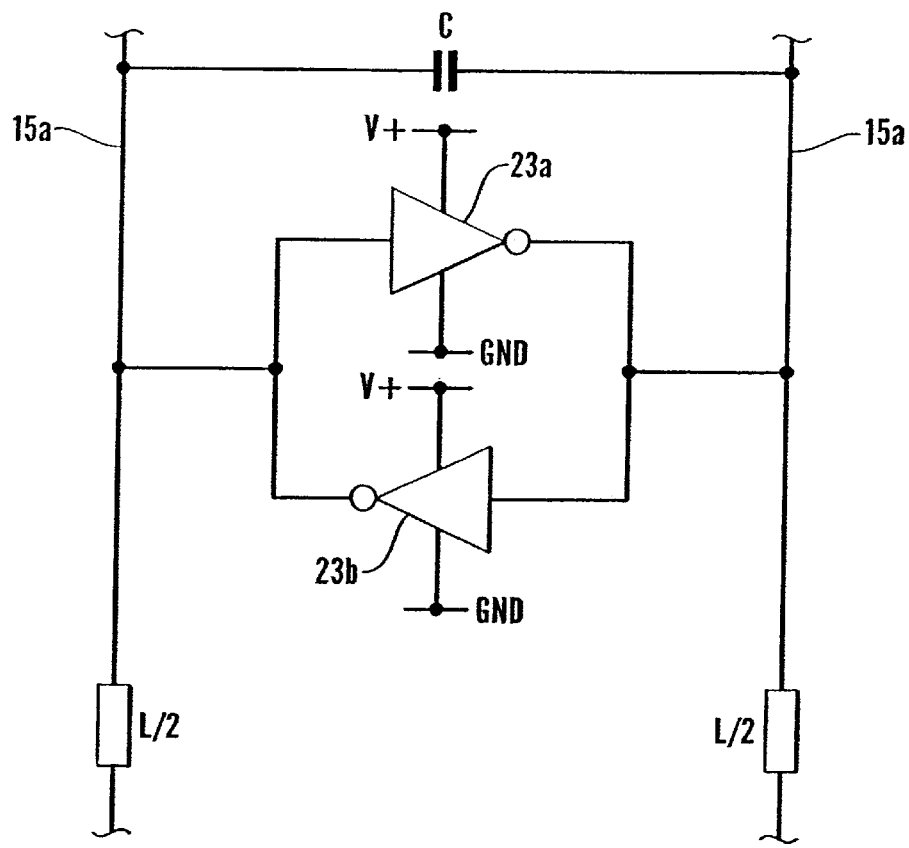
FIG. 12 shows a pair of back-to-back inverters connected across part of a transmission-line.
Figure 13A:
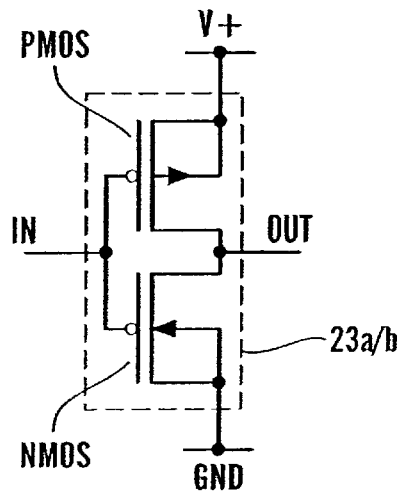
FIGS. 13a and 13b are outline and equivalent circuit diagrams of CMOS back-to-back inverters.

FIG. 12 shows a pair of back-to-back inverters 23a, 23b with supply line connectors and indications of distributed inductive (L/2) and capacitive (C) elements of a transmission-line as per FIG. 5b. FIG. 13a shows N-channel and P-channel Mosfet implementation of the back-to-back inverters 14a and 14b, see out of NMOS and PMOS transistors.

Figure 13B:
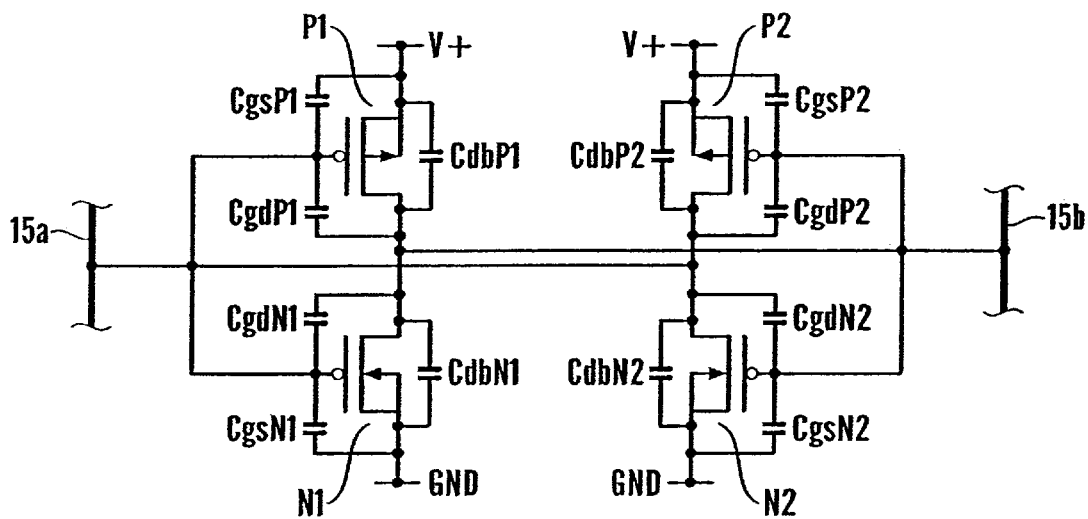

FIG. 13b shows an equivalent circuit diagram for NMOS (N1, N2) and PMOS (P1, P2) transistors, together with their parasitic capacitances. The gate terminals of transistors P1 and N1 are connected to the conductive trace 15a and to the drain terminals of transistors P2 and N2. Similarly, the gate terminals of transistors P2 and N2 are connected to the conductive trace 15b and to the drain terminals of transistors P2 and N2. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms Φ1 and Φ2 are thus much faster than for prior circuits.

Figure 14A:
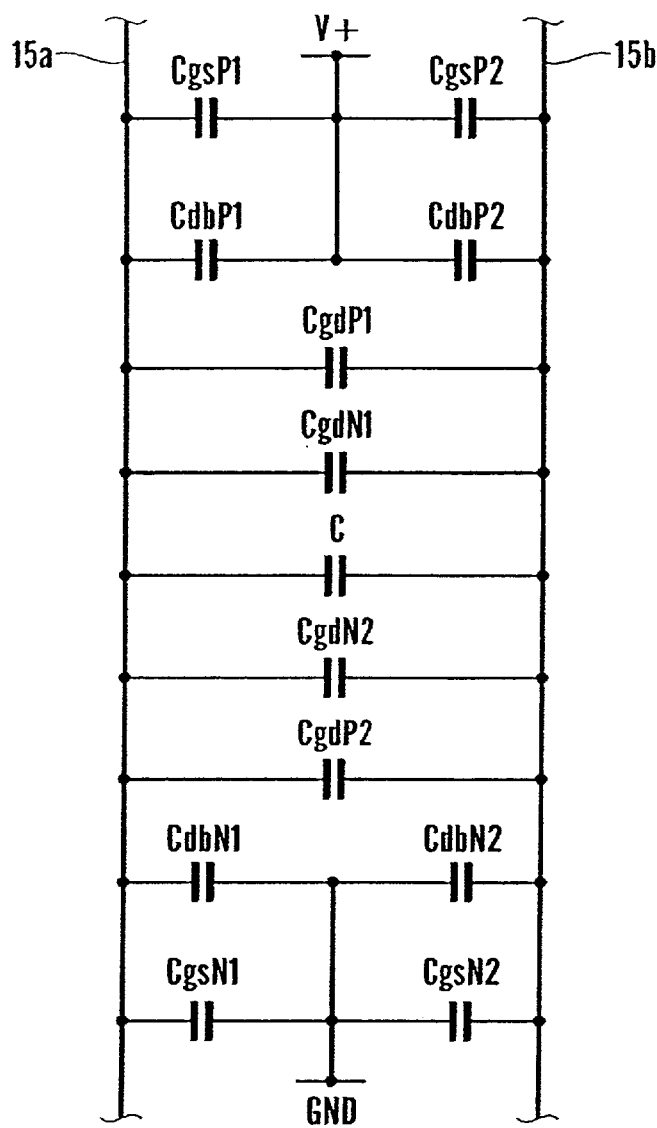
FIG. 14a details capacitive elements of a transmission-line together with CMOS transistors.
Figure 14B:
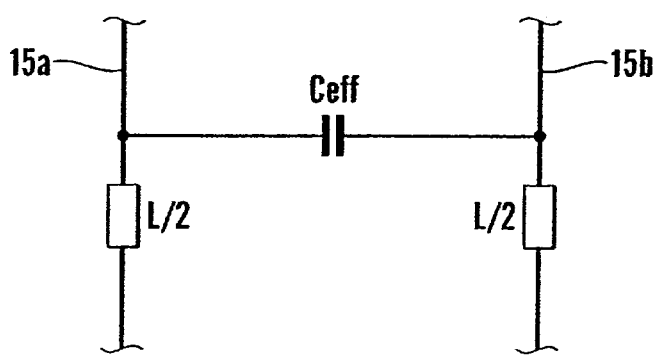

For clarity FIGS. 12–14 omit related resistive (R) elements. FIG. 14a shows only the capacitive elements (as per FIGS. 12 and 13b) of the transmission-line 15 together with those of the N/PMOS transistors. FIG. 14b illustrates another equivalent circuit diagram for FIG. 14a including the transmission-line distributed inductive (L/2) elements and the effective capacitance Ceff given by:

$$Ceff=C+CgdN+CgdP+[(CgsN+CdbN+CgsP+CdbP)/4];$$

Where:
CgdN=CgdN1+CgdN2;
CgdP=CgdP1+CgdP2;
CgsN=CgsN1+CgsN2;
CdbN=CdbN1+CdbN2;
CgsP=CgsP1+CgsP2; and
CdbP=CdbP1+CdbP2.

Capacitance loading due to gate, drain, source and substrate junction capacitances are preferably distributed as mentioned previously.

An advantage of having a differential- and common-mode, transmission-line, is that 'parasitic' capacitances inherent within mosfet transistors can be absorbed into the transmission-line impedance Zo, as illustrated in FIGS. 14a and 14b, and can therefore be used for energy transfer and storage. The gate-source capacitances (Cgs) of the NMOS and PMOS transistors appear between the signal conductor traces 15a, 15b and their respective supply voltage rails and can be compensated for by removing the appropriate amount of respective capacitance from connections of the transmission-line 15 to the supply voltage rails, say by thinning the conductor traces 15a, 15b by an appropriate amount. The gate-drain capacitance (Cgd) of the NMOS and PMOS transistors appear between the conductive traces 15a and 15b and can be compensated for by proportionally increasing the spacing 66 between the conductive traces 15a, 15b at connections to the NMOS and PMOS transistors of the inverters 23a/b.

By way of a non-restrictive example, on a 0.35 micron CMOS process, a usable 5 GHz non-overlapping clock signal should result with transmission-line loop length (S/2) of 9 mm for a phase velocity of 30% of speed-of-light, as determined by capacitive shunt loading distribution and dielectric constants, the total length (S), of the conductor 17 thus being 18 mm.

The substrate junction capacitances (Cdb) of the NMOS and PMOS transistor could be dramatically reduced by using semi-insulating or silicon-on-insulator type process technologies.

There is a continuous DC path that directly connects the terminals of each of the amplifiers 21, i.e. the respective input/output terminals of each and all of the inverters 23a, 23b, but this path is characterised by having no stable DC operating point. This DC instability is advantageous in relation to the regenerative action of each of the respective amplifiers $21_1$–$21_4$ and their positive feedback action.

Transmission-lines 15 hereof can be routed around functional logic blocks as closed-loops that are 'tapped into' to get 'local' clock signals. CMOS inverters can be used as 'tap amplifiers' in a capacitive 'stub' to the transmission-line 15, which can be 'resonated out' by removing an equivalent amount of 'local' capacitance from the transmission-lines, say by local thinning of conductor traces (15a/15b) as above. Capacitive 'clock taps' can be spread substantially evenly along a transmission-line 15 hereof having due regard as a matter of design to their spacings, which, if less than the wavelength of the oscillating signal, will tend to slow the propagation of the EM wave and lower the characteristic impedance Zo of the transmission-line (15), but will still result in good signal transmission characteristics.

Figure 15:
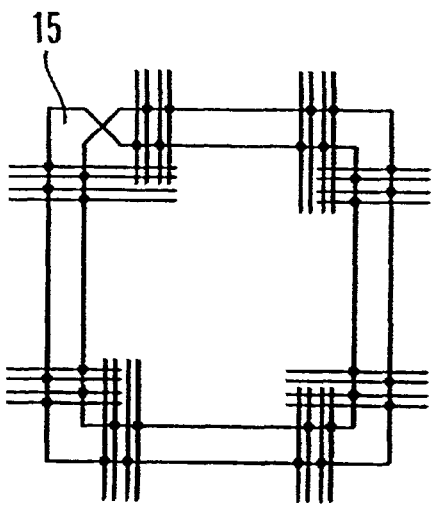
FIG. 15 shows capacitive stub connections to a transmission-line.

Within functional logic blocks that are small relative to clock signal wavelength, unterminated interconnects work adequately for local clocking with phase coherence, see FIG. 15. For clarity, the pairs of connections to the transmission-line 15 are shown slightly offset, though they would typically be opposite each other in practice. Alternative tap-off provisions include light bidirectional of passive resistive, inductive or transmission-line nature, or unidirectional or inverting connections, including much as for what will now be described for interconnecting transmission-lines 15 themselves.

Plural oscillators and transmission-lines 15 can readily be operatively connected or coupled together in an also inventive manner, including synchronising with each other both in terms of phase and frequency provided that any nominal frequency mismatch is not too great. Resistive, capacitive, inductive or correct length direct transmission-line connections/couplings, or any combinations thereof, can make good bidirectional signal interconnections. Signal connection or coupling between transmission-lines can also be achieved using known coupling techniques as used for microwave micro-strip circuits, generally involving sharing of magnetic and/or electrical flux between adjacent transmission lines. Unidirectional connections can also be advantageous. Connectors and couplings hereof are capable of maintaining synchronicity and coherency of plural transmission-line oscillators throughout a large system, whether within ICs or between IC's say on printed circuit boards (PCBs).

Connection/coupling of two or more transmission-lines and cross-connection rules are similar to Kirchoff's current law but based on the energy going into a junction, i.e. a connection or coupling, of any number of the transmission-lines being equal to the energy coming out of the same junction, i.e. there is no energy accumulation at the junction. When the supply voltage V+ is constant, the rule is, of course, precisely Kirchoff's current law. By way of a practical example, if there is a junction common to three transmission-lines, the simplest, but not the only, solution is that one of the transmission-lines has half the characteristic impedance of the other two transmission-lines. Where there are any even number of coupled transmission-lines, their respective characteristic impedances can all be equal. However, there are an infinite number of combinations of impedances which will satisfy Kirchoffs current law. The cross-connection rule, within a transmission-line, is the same as the rules for coupling two or more transmission-lines described above.

There will be high quality differential signal waveforms Φ1 and Φ2, in terms of phase and amplitude, at all points around a transmission-line network 15 when the following criteria are met.

(i) the transmission-lines have substantially matching electrical lengths
(ii) above Kirchoff-like power rules are satisfied
(iii) there is phase inversion.

There are, of course, an infinite number of coupled network designs and supply voltages that will fulfill the above three criteria, such as for example: short sections of slow, low impedance transmission-lines that are coupled to long fast, high impedance transmission-lines; and one-and/or three-dimensional structures etc. However, for the best wave-shapes and lowest parasitic power losses, the phase velocities of the common-mode and the differential-mode, i.e. even and odd modes, should be substantially the same. The same, or substantially the same, phase velocities can be designed into a system by varying the capacitances of the transmission-lines.

The supply voltage V+ does not have to be constant throughout a system, provided that above Kirchoff-like power/impedance relationships are maintained and result in an inherent voltage transformation system that, when combined with the inherent synchronous rectification by the inverters 23a and 23b, allows different parts of the system to operate at different supply voltages, and power to be passed bi-directionally between such different parts of the system.

Figure 16:
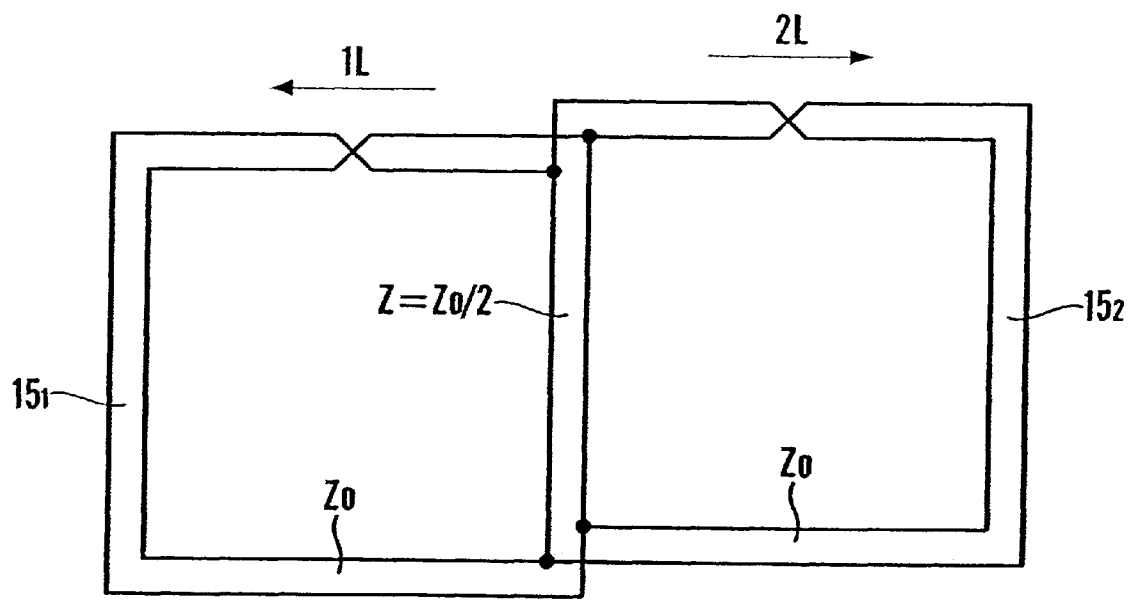
FIG. 16 shows one connection for self-synchronising transmission-line oscillators.

FIG. 16 shows two substantially identical transmission-line oscillators hereof that are operatively connected such that they are substantially self-synchronising with respect to frequency and phase. The transmission-lines $15_1$ and $15_2$ are shown 'siamesed' with the common part of their loop conductive traces meeting above Kirchoff-like power/impedance rule by reason of its impedance being half the impedances (20) of the remainders of the transmission-lines $15_1$ and $15_2$, because the common parts carry rotating wave energy of both of the two transmission-lines $15_1$ and $15_2$. As noted above, the originating trace length S of a transmission-line is one factor in determining the frequency of oscillation so transmission-lines $15_1$ and $15_2$ using the same medium and of substantially identical length S will have substantially the same frequency of oscillation F and will be substantially phase coherent. In FIG. 16, respective EM waves will travel and re-circulate in opposite directions around the transmission-lines $15_1$ and $15_2$, see marked arrows 1L, 2L (or both opposite), in a manner analogous to cog wheels. Such siamesing connection of transmission-lines can readily be extended sequentially to any number of such 'cogged' transmission-line oscillators.

Figure 17A:
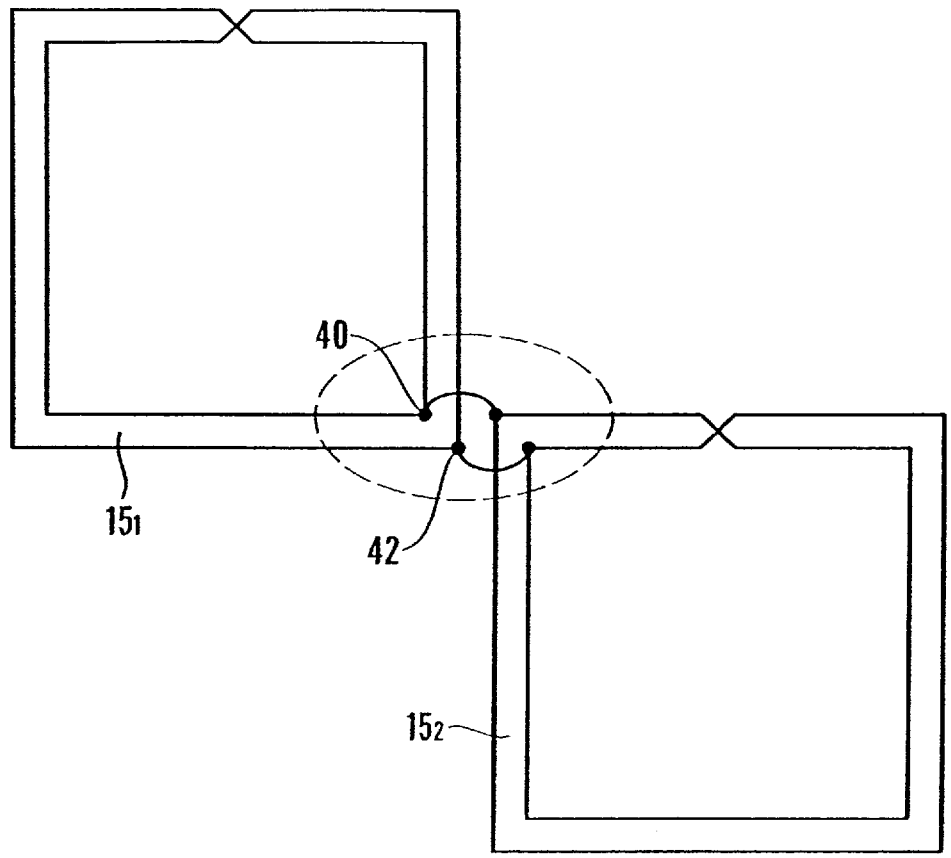
FIGS. 17a–17c show other connections for self-synchronising transmission-line oscillators.
Figure 17B:
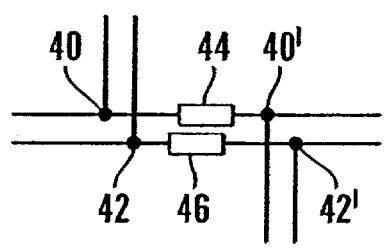
Figure 17C:
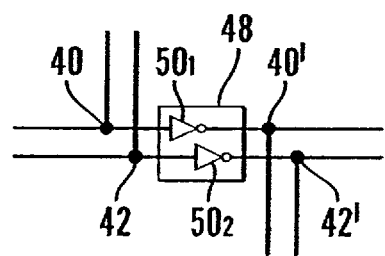
Figure 18:
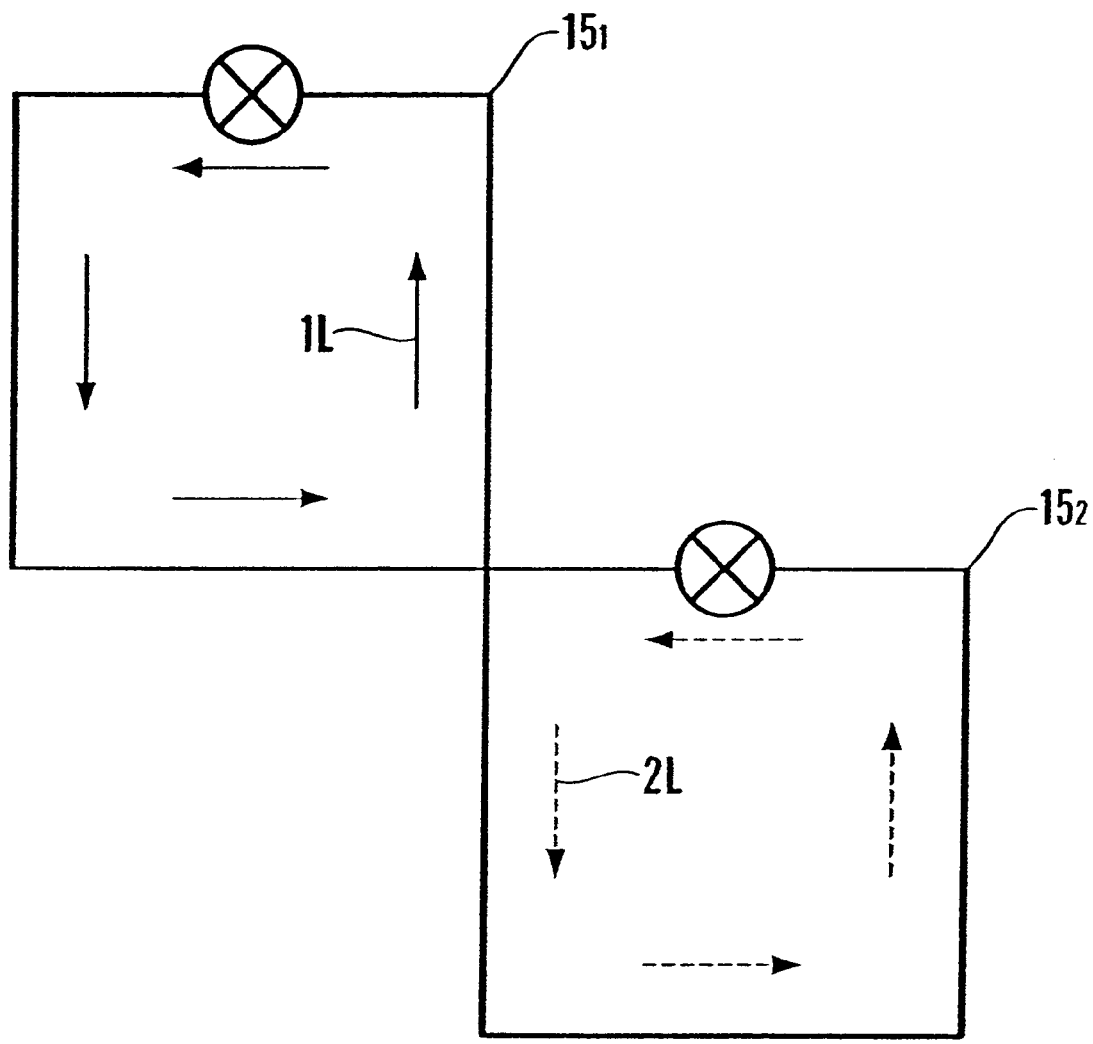

FIG. 17a shows another example of two substantially identical transmission-line oscillators with their transmission lines $15_1$ and $15_2$ operatively connected to be substantially self-synchronising in frequency and phase by direct connections at two discrete positions 40 and 42. FIG. 17b shows such direct connections via passive elements 44, 46 that could be resistive, capacitive or inductive or any viable combination thereof. FIG. 17c shows such direct connections via unidirectional means 48 that can be two inverters $50_1$ and $50_2$. The unidirectional means 48 ensures that there is no coupling or signal reflection from one of the transmission-lines ($15_2$) back into the other ($15_1$), i.e. only the other way about. Directions of travel of re-circulating EM waves are again indicated by arrows 1L, 2L that are solid but arbitrary for transmission-line oscillator $15_1$ and dashed for $15_2$ in accordance with expectations as to a 'parallel'-coupled pair of transmission-lines yielding contra-directional travelling waves. FIG. 18 is a convenient simplified representation of the two self-synchronised transmission-line oscillators of FIG. 17a, and similar representations will be used in following Figures.

Figure 19A:
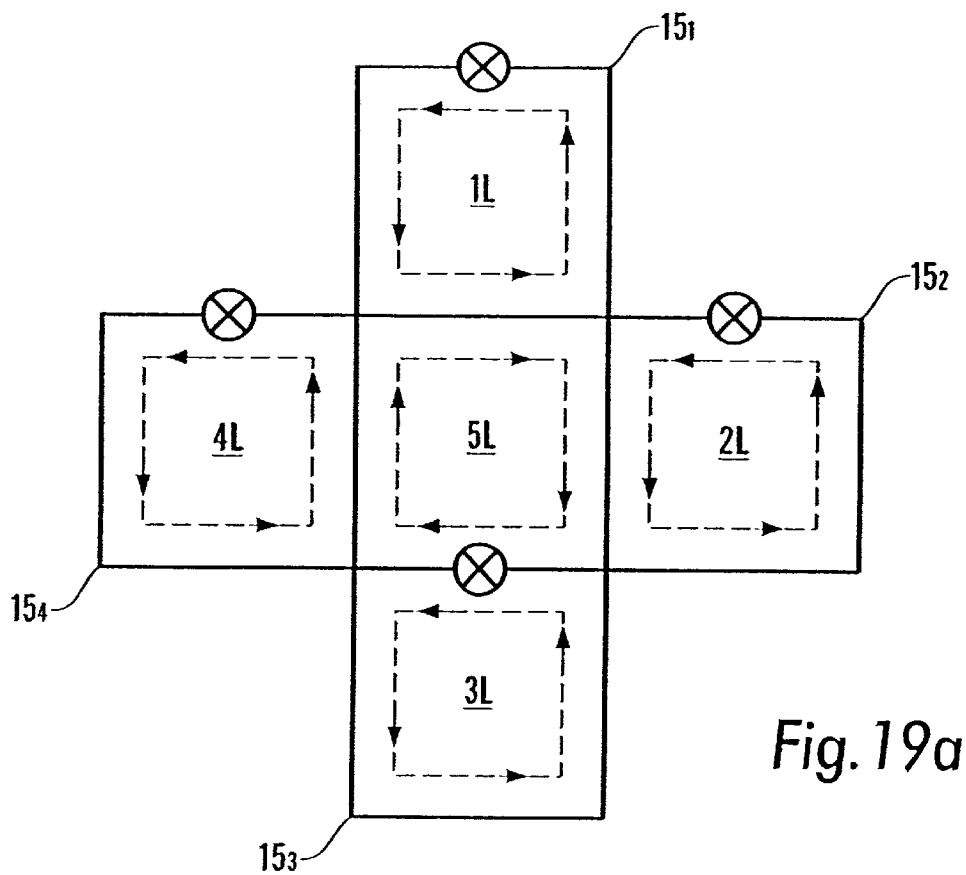
FIGS. 19a and 19b show connection of four transmission-line oscillators.

FIG. 19a shows four self-synchronised transmission-line oscillators $15_1$–$15_4$ connected together basically as for FIGS. 17a–17c, but so as further to afford a central fifth effective transmission-line timing signal source of this invention affording a re-circulatory travelling EM wave according to indicated EM wave lapping directions 1L–4L of the four transmission-line oscillators $15_1$–$15_4$. As shown the central fifth transmission-line oscillator physically comprises parts of each of the other four, and has a lapping direction 5L that is opposite to theirs, specifically clockwise for counter-clockwise 1L–4L. It will be appreciated that this way of connecting transmission-line oscillators together can also be extended to any desired number and any desired variety of overall pattern to cover any desired area.

Figure 19B:
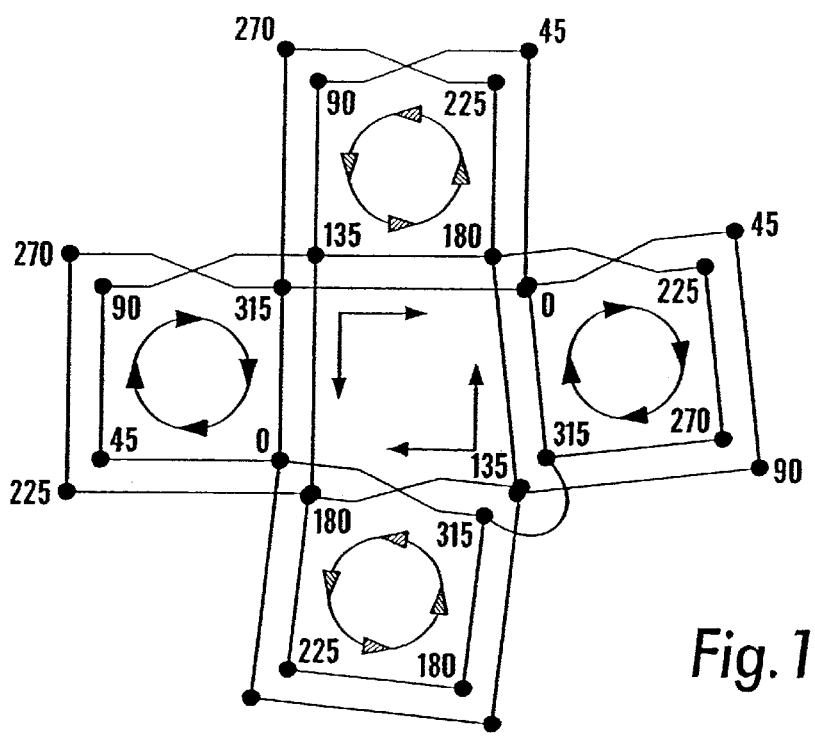

An alternative is shown in FIG. 19b where the central fifth transmission-line oscillator is not of re-circulating type, but is nonetheless useful and could be advantageous as to access to desired phases of timing signals.

Figure 20:
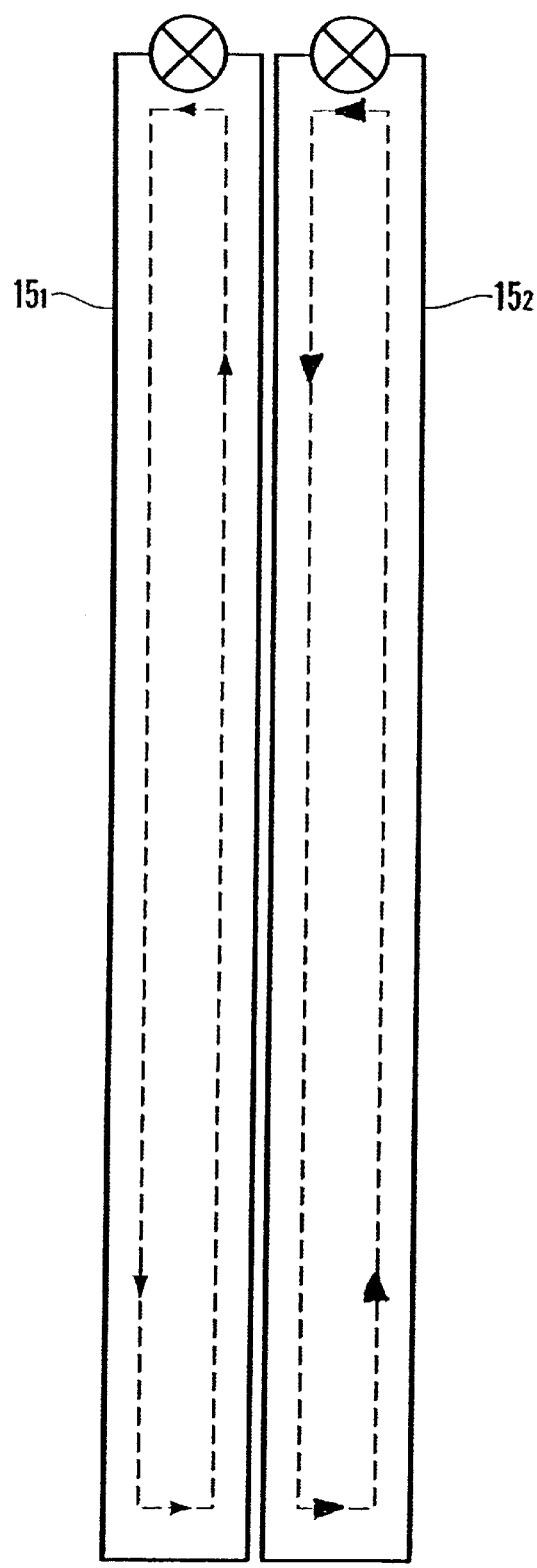
FIGS. 20 and 21 show magnetically coupled self-synchronised transmission-line oscillators.
Figure 21:
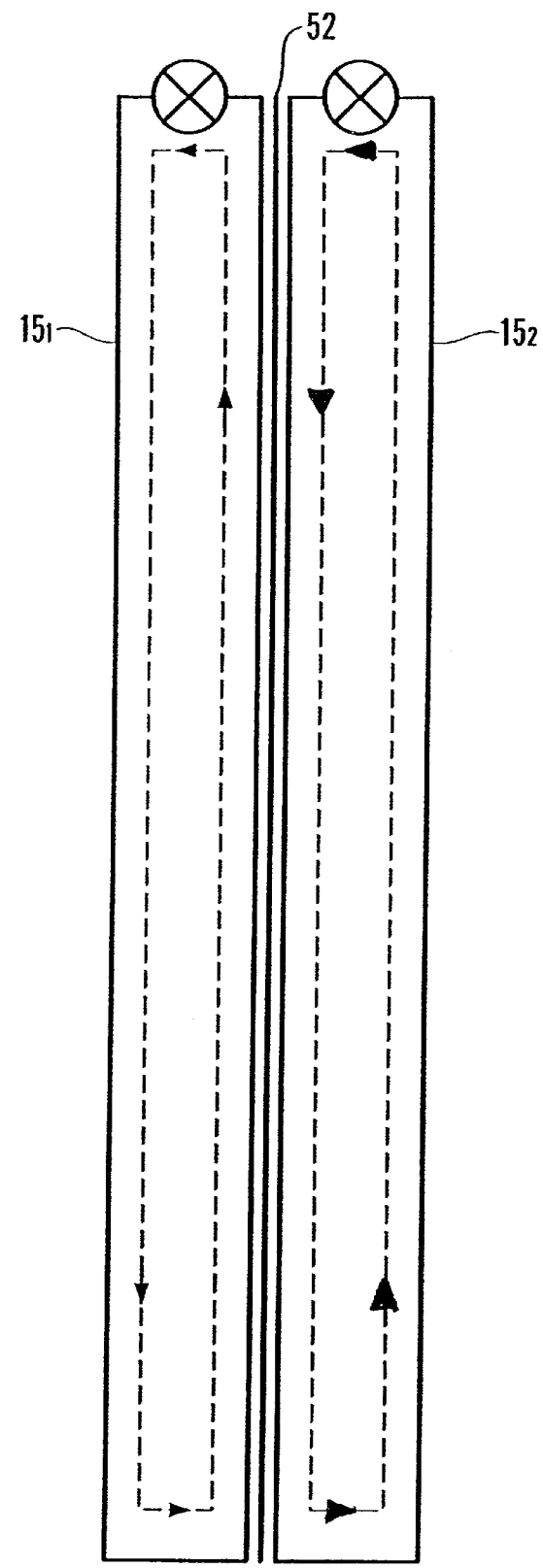

FIG. 20 shows two self-synchronising oscillators with their transmission-lines $15_1$ and $15_2$ not physically connected together, rather operatively coupled magnetically, for which purpose it can be advantageous to use elongated transmission-lines to achieve more and better magnetic coupling. FIG. 21 shows another example of magnetically coupled self-synchronising oscillators with transmission-lines $15_1$ and $15_2$ generally as for FIG. 20, but with a coupling enhancing ferromagnetic strip 52 operatively placed between adjacent parts to be magnetically coupled.

Figure 22:
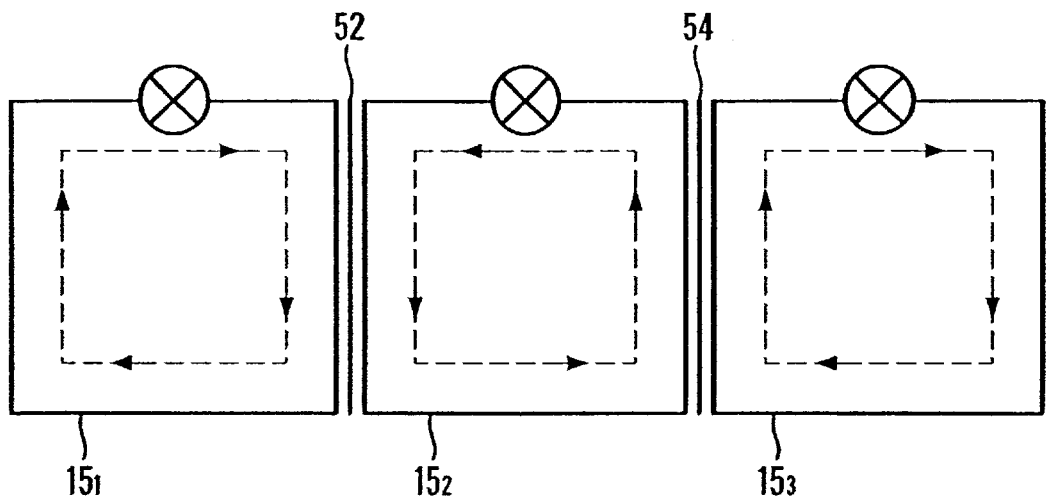
FIG. 22 shows three magnetically couple self-synchronised transmission-line oscillators.

FIG. 22 shows three self-synchronising oscillators with their transmission-lines $15_1$, $15_2$ and $15_3$ magnetically coupled by a first ferrous strip 52 placed between transmission-lines $15_1$ and $15_2$ and a second ferrous strip 54 placed between transmission-lines $15_2$ and $15_3$. As a source of oscillating signals, the transmission-line $15_2$ does not need any regenerative provisions 21 so long as enough energy for oscillation is magnetically coupled from the other transmission-lines $15_1$ and $15_3$ that are complete with provisions 21. It is considered practical for the transmission-line $15_2$ to be longer and circumscribe a larger area but not to need or have regenerative provisions 21, nor a cross-over 19; and is then preferably an odd multiple (3S, 5S, 7S etc) of the length (S) or at least the electrical length of at least one of the transmission-lines $15_1$ and $15_3$. This, of course, has further implications for self-synchronising frequency- and phase-locking of oscillators (say as using transmission-lines $15_1$ and $15_3$), at a considerable spacing apart.

Further alternatives include use of a dielectric material (not illustrated) that spans over and/or under the portions of the conductive traces to be electromagnetically coupled.

Figure 23:
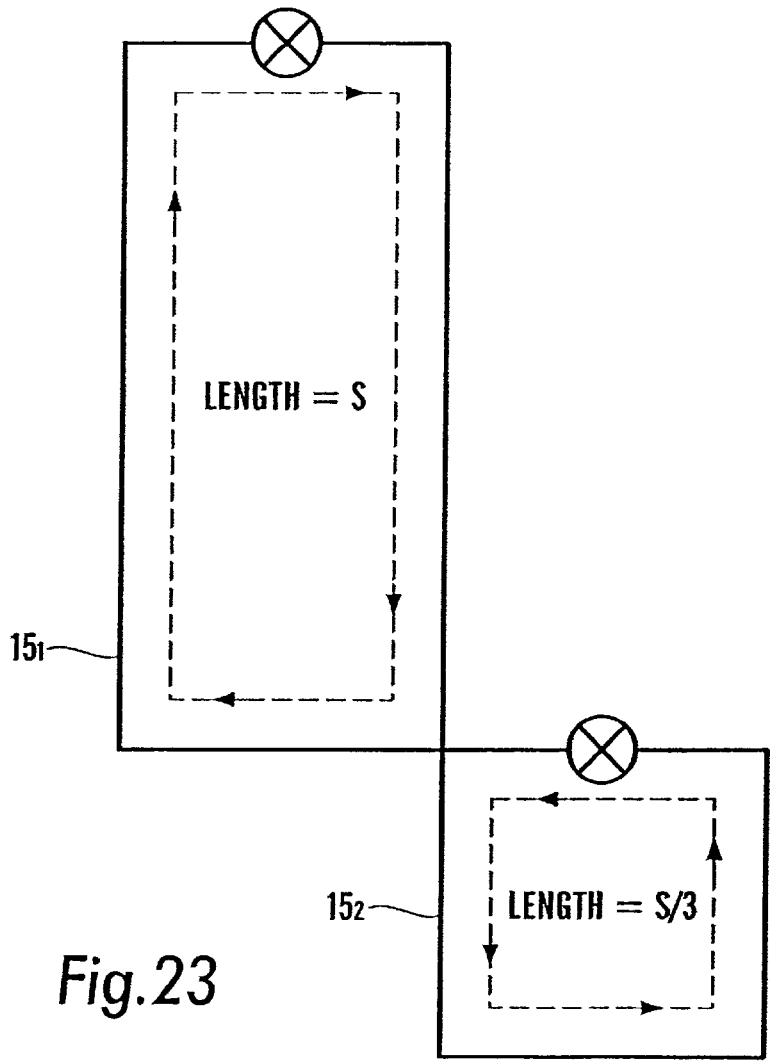
FIG. 23 shows connetion of self-synchronising transmission-lines oscillators of different frequencies.

It is feasible and practical to synchronise transmission-line oscillators operating at different frequencies. In FIG. 23, transmission-lines of two self-synchronising oscillators are of different electrical lengths. Specifically, using same transmission-line structure/materials, first transmission-line 15, has a total conductive length S for a fundamental oscillating frequency F=F1 and is operatively connected and synchronised to a second transmission-line $15_2$ having a total conductive length that is one third of that of the first transmission-line $15_1$, i.e. S/3, thus an oscillating frequency of 3F. The dashed lines with arrows indicate the direction of rotation of the EM waves. Operative connection is as for FIGS. 17a–c, though any other technique could be used. Self-synchronising is due to above-mentioned presence in the highly square first transmission-line signal of a strong third harmonic (3F). Similar results are available for higher odd harmonics, i e. at frequencies of 5F, 7F etc.

Preferred coupling between transmission-lines of oscillators operating at such different odd harmonic related frequencies, is unidirectional so that the naturally lower frequency line ($15_1$) is not encouraged to try to synchronise to the naturally higher frequency line ($15_2$). Any number of transmission-line oscillators of different odd-harmonically related frequencies can be coupled together and synchronised as for FIG. 23.

Re-circulatory transmission-line oscillators hereof can be used in and for the generation and distribution of reference, i.e. clock, timing signal(s) in and of a semiconductor integrated circuit (IC); and is also applicable to a printed-circuit-board (PCB), e.g. as serving to mount and interconnect circuitry that may include plural ICs, or indeed, any other suitable apparatus/system where timing reference signal(s) is/are required.

For ICs as such, simulations using the industry standard SPICE techniques show potential for supplying clock signals of very high frequencies indeed, up to several tens of GHz, depending upon the IC manufacturing process employed and projections for their development. Generation and distribution can effectively be at, and service, all parts of an IC with predictable phases at and phase relationships between such parts, including as multiple clock signals that may have the same or different frequencies. Moreover, principles of operation of transmission-line oscillators hereof and their self-synchronising inter-coupling extend or lead readily not only to reliable service of timing signals to operational circuitry within any particular IC and between ICs, but further and it is believed also importantly and inventively to data transfer between ICs etc.

The entire transmission-line 15 structure and network involving regenerative circuits 21 oscillates. The transmission-line 15 operates unterminated, i.e. the transmission-line forms a closed-loop. The characteristic impedance Zo of the transmission-line is low and only 'top-up' energy is required to maintain oscillation.

Impedance between the two conductor traces 15a, 15b is preferably evenly distributed, thus well balanced, which helps achieve well defined, differential signal waveforms ($\Phi 1$ and $\Phi 2$). Coherent oscillation occurs when the signals $\Phi 1$, $\Phi 2$ on the transmission-line 15 meet this 180°, or substantially a 180°, phase shift requirement for all inverting amplifiers 21 connected to the transmission-line 15 i.e. when all the amplifiers 21 operate in a co-ordinated manner with known phase relationship between all points along the transmission-line 15. Signal energy is transmitted into the transmission-line 15 both inductively and capacitively, i.e. magnetically and electrically, between the signal conductors 15a, 15b for the differential-mode, also between each signal conductor and the ground reference for the two individual common-mode (not present if the upper and lower 'ground' planes are absent, nor for connections via unshielded twisted-pair cables).

CMOS inverters as non-linear, operative switching and amplifying circuit elements have low losses from cross-conduction current as normally lossy transistor gate 'input' and drain 'output' capacitances are absorbed into the characteristic impedance Zo of the transmission-line 15, along with the transistor substrate capacitances, so power consumption is not subject to the usual $1/2 \cdot CV^2 \cdot f$ formula.

It is quite often assumed that the power dissipation due to capacitive charging and discharging of MOS transistor gates, for example, is unavoidable. However, the self sustaining oscillating nature of the transmission-line 15 is able to 'drive' the transistor gate terminals with low power loss. This is due to the fact that the required 'drive' energy is alternating between the electrostatic field, i.e. the capacitive field of the MOS gate capacitances, and the magnetic field, i.e. the inductive field elements of the transmission-line 15. Therefore, the energy contained within the transmission-line 15 is not being completely dissipated, it is in fact being recycled. Energy saving applies to all operatively connected transistor gates of the transmission-line 15.

It is envisaged that such low loss efficiency of transmission-line oscillators could well be used to 'clock' ICs for many previously popular logic systems that have since been overshadowed or abandoned as non-viable options for reasons attributed to problems associated with clock skew, clock distribution, power consumption etc. Non-exhaustive examples of such logic arrangements include poly-phase logic and charge recovery or adiabatic switching logic, such logic arrangements being known to those skilled in the art.

Figure 24:
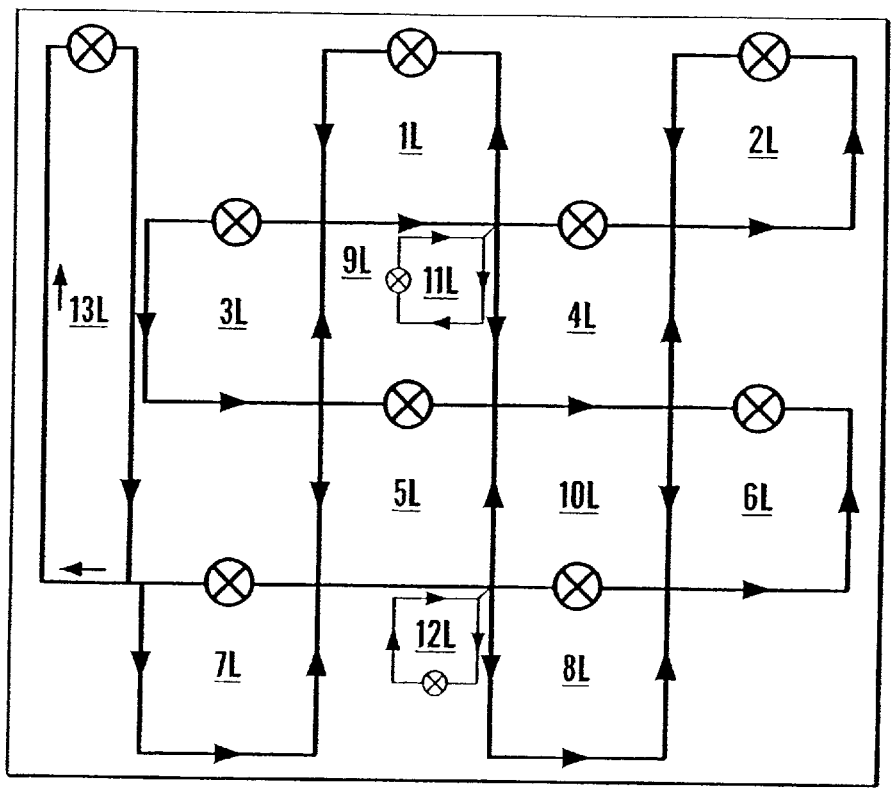
FIG. 24 shows an example of a clock distribution network for a monolithic IC.

FIG. 24 shows a possible clock distribution network hereof as applied to a monolithic IC 68 (not to scale, as is other Figures hereof). The IC 68 has a plural transmission-lines hereof shown as loops 1L–13L, of which loops 1L–10L and 13L all have the same effective lengths (say as for S above) and oscillate at a frequency F, and loops 11L and 12L each have shorter loop lengths (say as for S/3 above) and oscillate at a frequency 3F. Loops 1L–8L and 11L–13L are full transmission-line oscillator complete with regenerative means, and loops 9L and 10L arise as parts of four of the former transmission-lines, namely 1L, 3L, 4L and 5L; 4L, 5L, 6L and 8L respectively.

The transmission-line (15) of the loop 13L is elongated with a long side close to the edge (i.e. scribe line) of the IC 68, so that it is possible to couple to another similarly set up separate monolithic IC for inter-coupling by such as flip-chip technology for frequency and phase locking by such as magnetic coupling, as described above. Phase and frequency locking of separate monolithic IC's can be very useful in such as hybrid systems.

Figure 25:
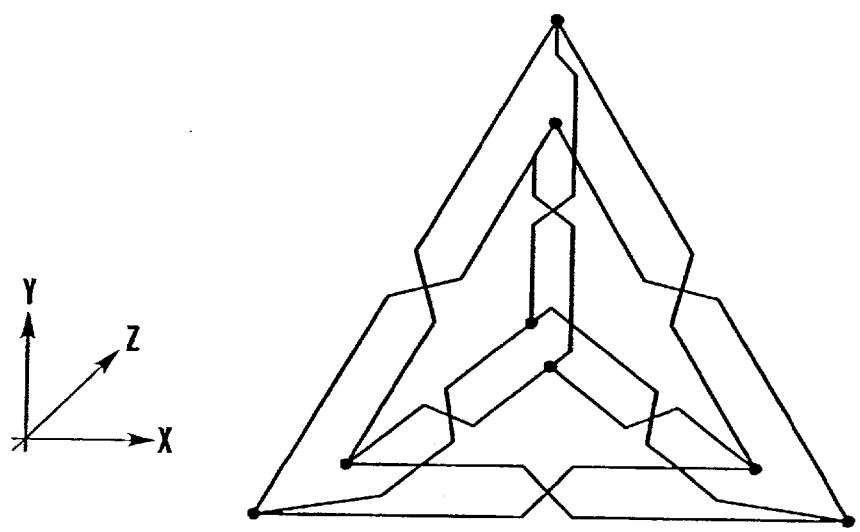
FIG. 25 shows 3D implementation for timing systems of GB00/04891.

FIG. 25 indicates feasibility of a three-dimensional network of interconnected transmission line oscillators hereof for signal distribution, specifically for a simple pyramidal arrangement, though any other structure could be serviced as desired, no matter how complex so long as interconnect rules hereof are met regarding electrical length, impedance matching, any phasing requirements for data transfer, etc.

ICs hereof can be designed to have whatever may be desired up to total frequency and phase locking, also phase coherence, including for and between two or more self-sustaining transmission-line oscillators greatly to facilitate synchronous control and operation of data processing activities at and between all the various logic and processing blocks associated with such IC.

Figure 26A:
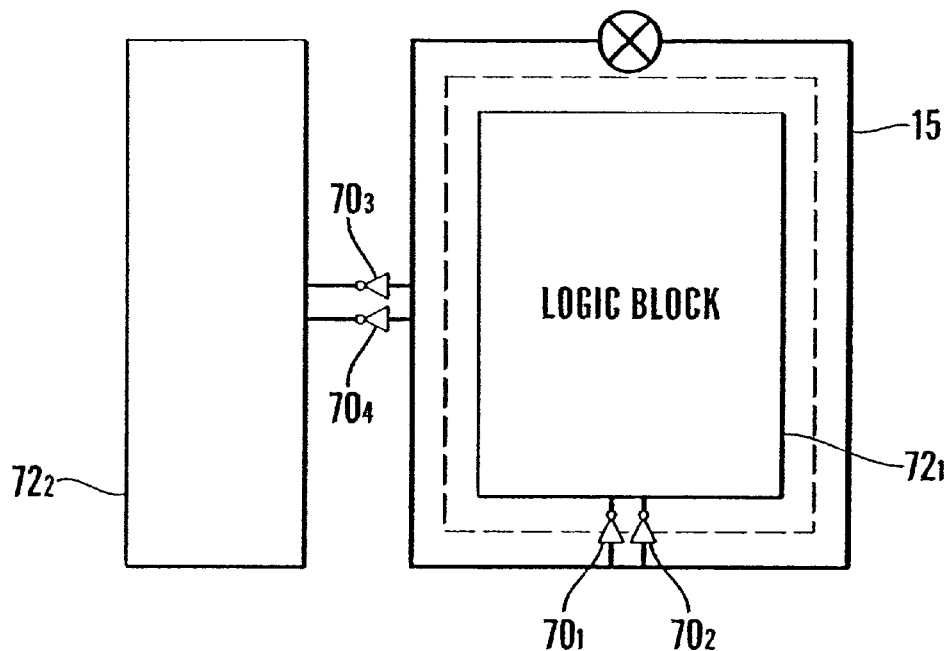
FIGS. 26a and 26b show examples of dual phase tap-off points.

FIG. 26a shows an example of dual phase tap-off using a pair of CMOS inverters $70_1$ and $70_2$ connected to the transmission-line conductive traces 15a and 15b respectively to provide local clock to and/or to be distributed about a logic block $72_1$. Whilst the logic block $72_1$ is shown as being 'enclosed' within the transmission-line 15 alternatives include it being outside any area enclosed by the transmission-line 15, as for the logic block $72_2$ and its associated inverters $70_3$, $70_4$, and/or it spanning the conductive traces 15a, 15b of the transmission line 15. If desired, say for large logic blocks $72_1$ and/or $72_2$ plural pairs of inverters 70 can 'tap' into the transmission-line 15, including for any desired phasing needed locally in the logic block 72, see dashed line. Capability accurately to select the phase of the oscillating clock signals Φ1, Φ2 allows complex pipeline logic and poly-phase logic (see FIG. 29 below) to be operatively designed and controlled.

Figure 26B:
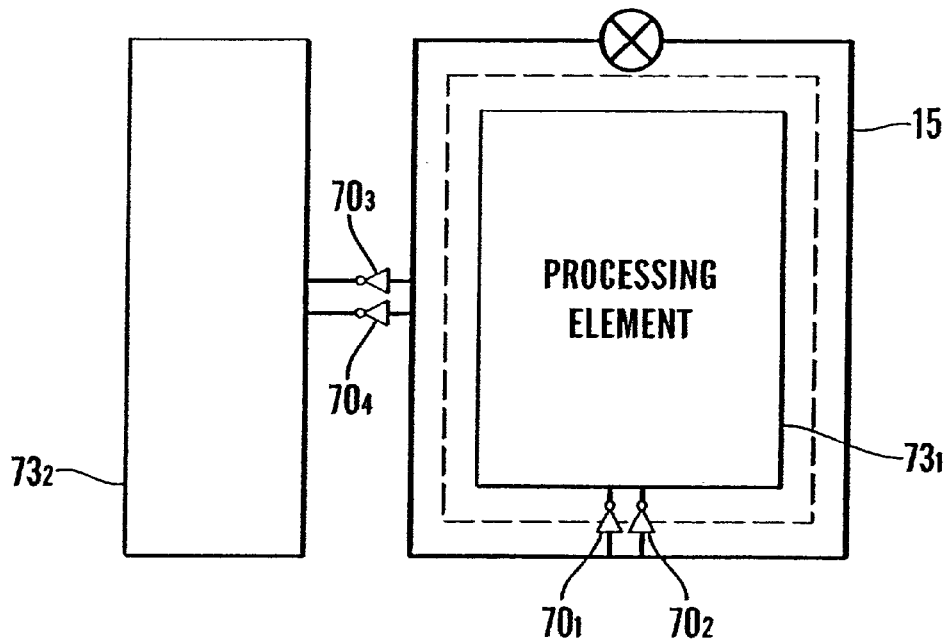

FIG. 26b differs in that the logic blocks $71_1$, $72_2$ are replaced by respective processing elements $73_1$, $73_2$, though there could be more, and for which one or more transmission-lines can be used to clock one or more of the processing elements. Two or a greater plurality of processing elements can operate independently and/or together, i.e. in parallel to achieve very fast and powerful data processing ICs/systems.

Figure 27:
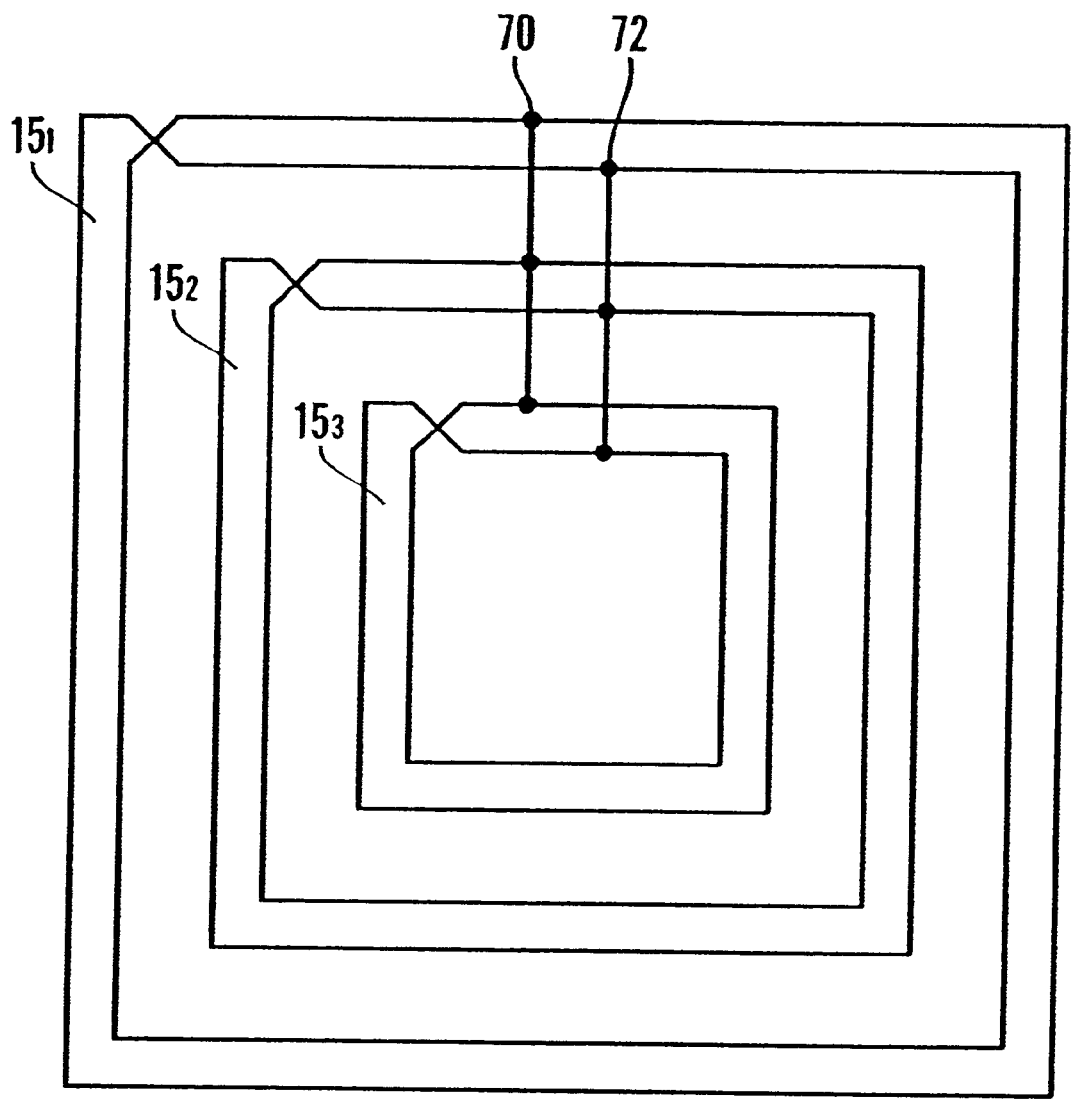
FIG. 27 shows three concentrically arranged transmission-line oscillators.

FIG. 27a shows concentrically arranged transmission-lines $15_1$–$15_3$ of progressively less physical lengths. However, each of the three transmission-lines $15_1$–$15_3$ can be made so that they all oscillate at the same frequency, whether as a matter of structure or by respective velocities of the EM waves rotating around each of the shorter transmission-lines $15_2$ and $15_3$ being suitably retarded by increasing their inductance and/or capacitance per unit length. Moreover, the transmission-lines $15_1$–$15_3$ can optionally have one or more operative connections 70 and 72 that will serve to synchronise the three transmission-lines $15_1$–$15_3$. The advantages, apart from synchronicity, of having these connections 70, 72 are that the transmission-lines $15_1$–$15_3$ will or can (i) act as a single multi-filament transmission-line;
(ii) have smaller conductive traces (15a, 15b);
(iii) cover a larger clocking area;
(iv) produce lower skin effect losses; and
(v) produce lower crosstalk and coupling.

Figure 28A:
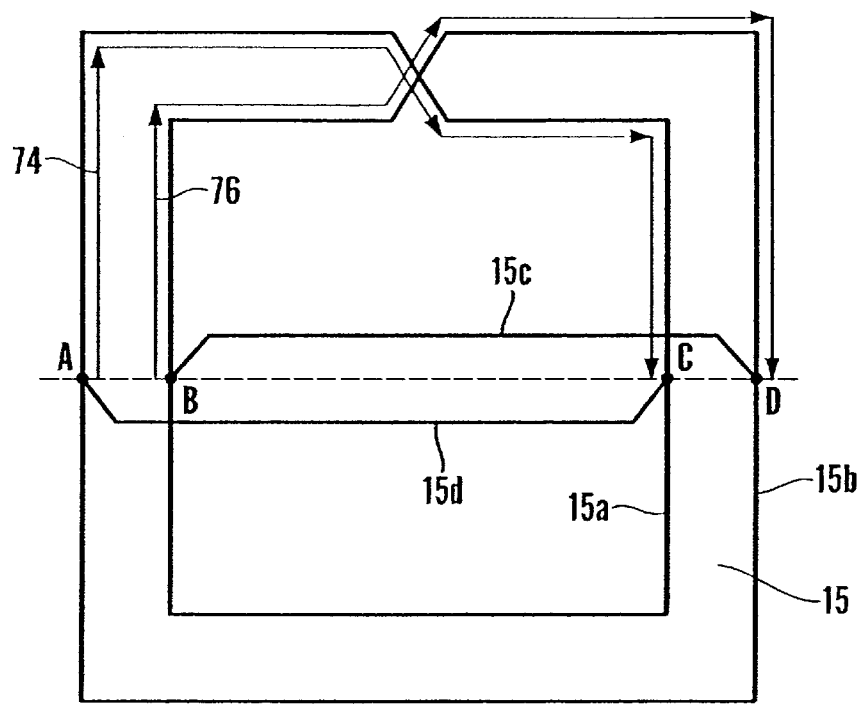
FIGS. 28a and 28b show a transmission-line having a cross-loop connection.
Figure 28B:
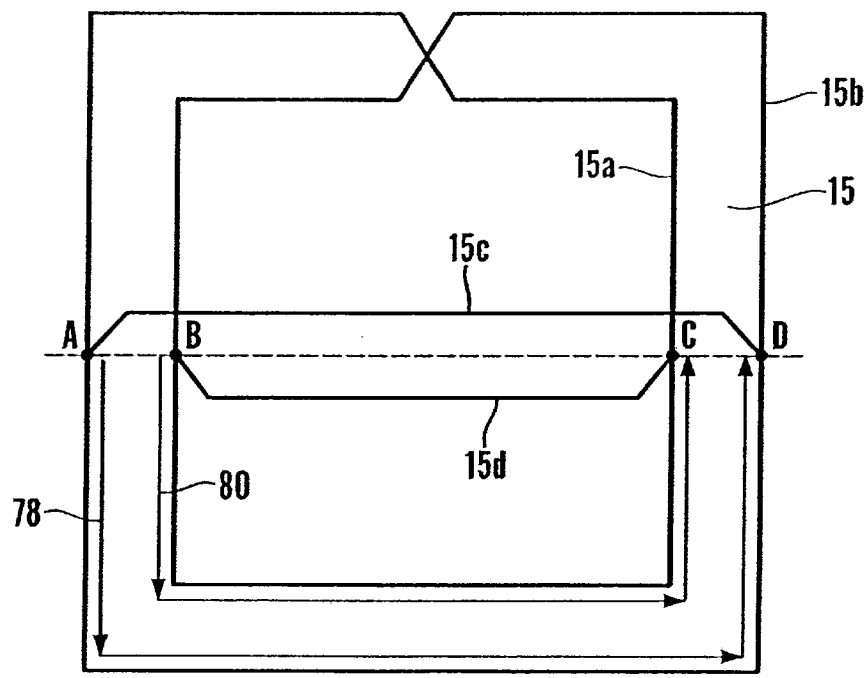

FIG. 28a shows a transmission-line having a cross-loop connection between positions A, B, C and D, which comprises further transmission-line 15c, 15d that has, in this particular example, an electrical length of 90° to match spacing of the positions A, B and C, D. Other cross-connection electrical length could be chosen, then operatively connected at correspondingly different spacings of the positions A, B and C, D. Cross-loop connections allow further tap-off positions within area enclosed by the transmission-line 15. The transmission-line part 15d is shown connected in parallel, between points A and C, and part of the transmission-line 15 represented by line 74. Likewise, the transmission-line part 15c is shown connected in parallel, between points B and D, with part of the transmission-line 15 represented by line 76. The transmission-line parts 15c, 15d, 74 and 76 will be satisfactory if they each have an impedance that is half that associated with the remainder of the transmission-line 15, as above. The transmission-lines 15 and 15c,d will have operatively connected amplifiers 21. FIG. 28b shows the cross-loop connection 15c,d and the positions A, B, C and D set up relative to parts 78 and 80 of the transmission-line 15, i.e. instead of parts 74 and 76, respectively; but with Kirchoff-type rules applying again to result in parts 15c, 15d, 78 and 80 each having an impedance of half that associated with the remainder of the transmission-line 15. Introduction of plural additional transmission-lines such as 15c,d across a transmission-line 15 is feasible as required.

Figure 29A:
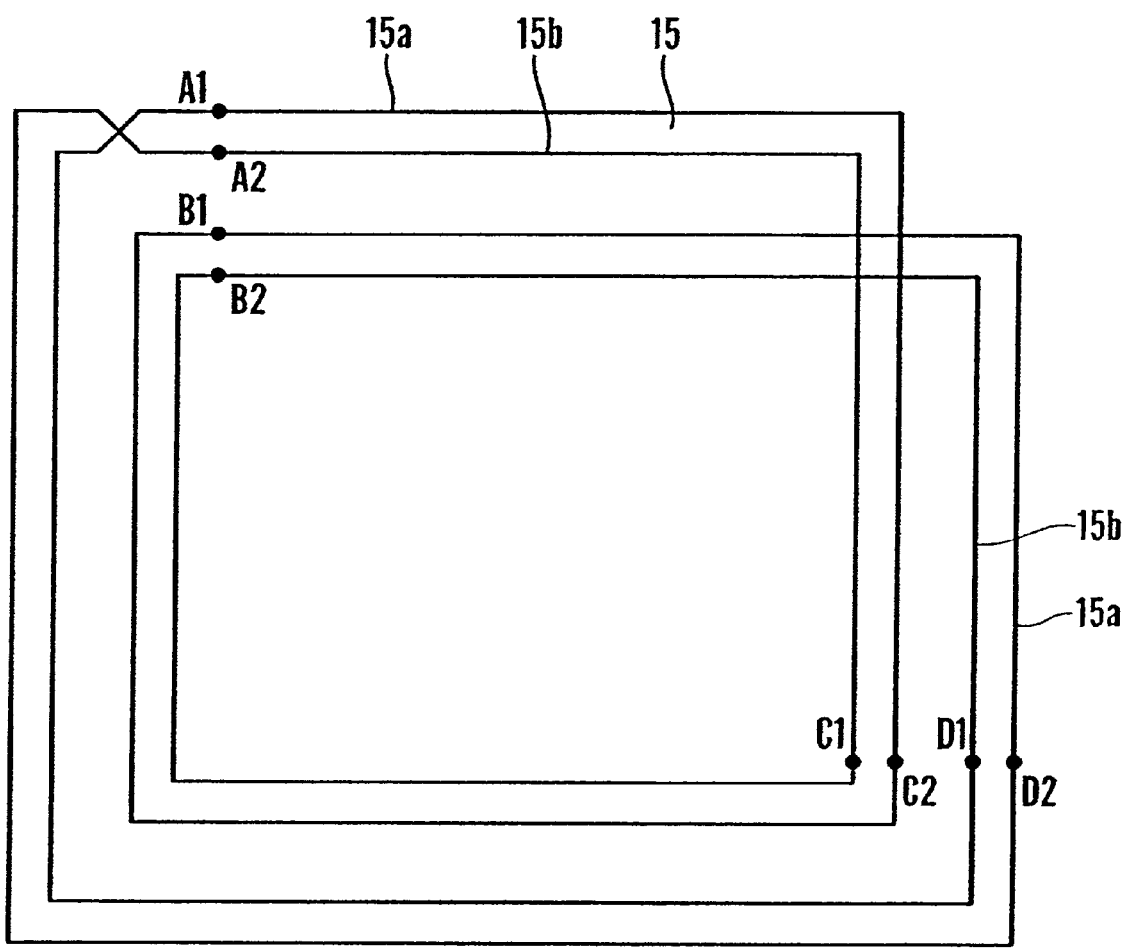
FIG. 29a shows a transmission-line configuration for four-phase signals.
Figure 29B:
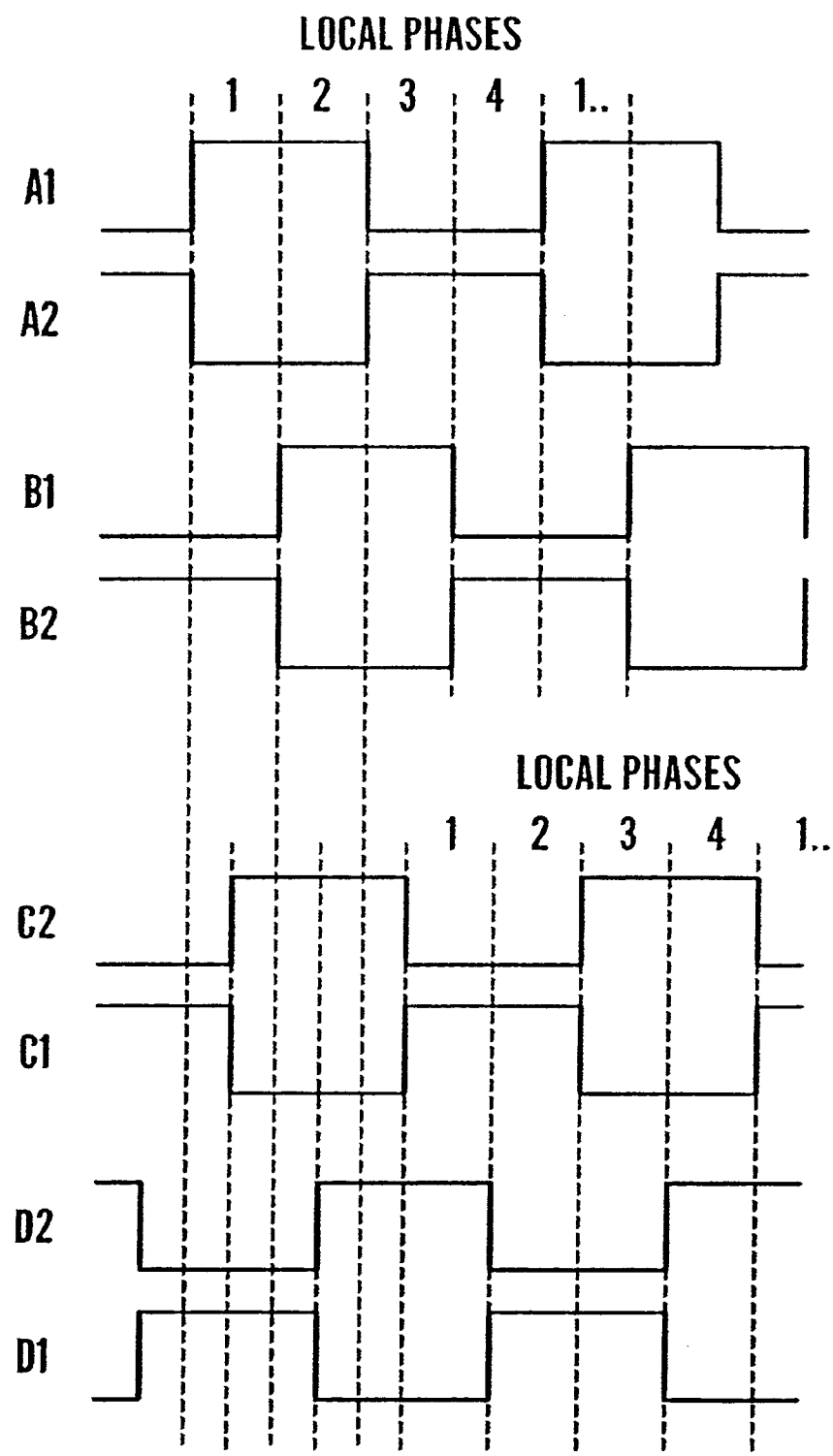
FIG. 29b shows idealised resulting four-phase signal waveforms.

FIG. 29a shows one way to produce four-phase clock signals. Effectively, a transmission-line 15 makes a double traverse of its signal carrying boundary, shown as rectangular, and further repeated traverses could produce yet more phases. In the example shown, the positions A1, A2, B1 and B2 will yield localised four-phase clock signals, as will the positions C1, C2, D1, and D2. The repeated boundary traverses will be with suitable mutual spacing/separation of the transmission-line 15 to avoid inter-coupling. FIG. 29b shows idealised four-phase signal waveforms at points A1, A2, B1 and B2 and at C1, C2, D1 and D2.

Figure 30:
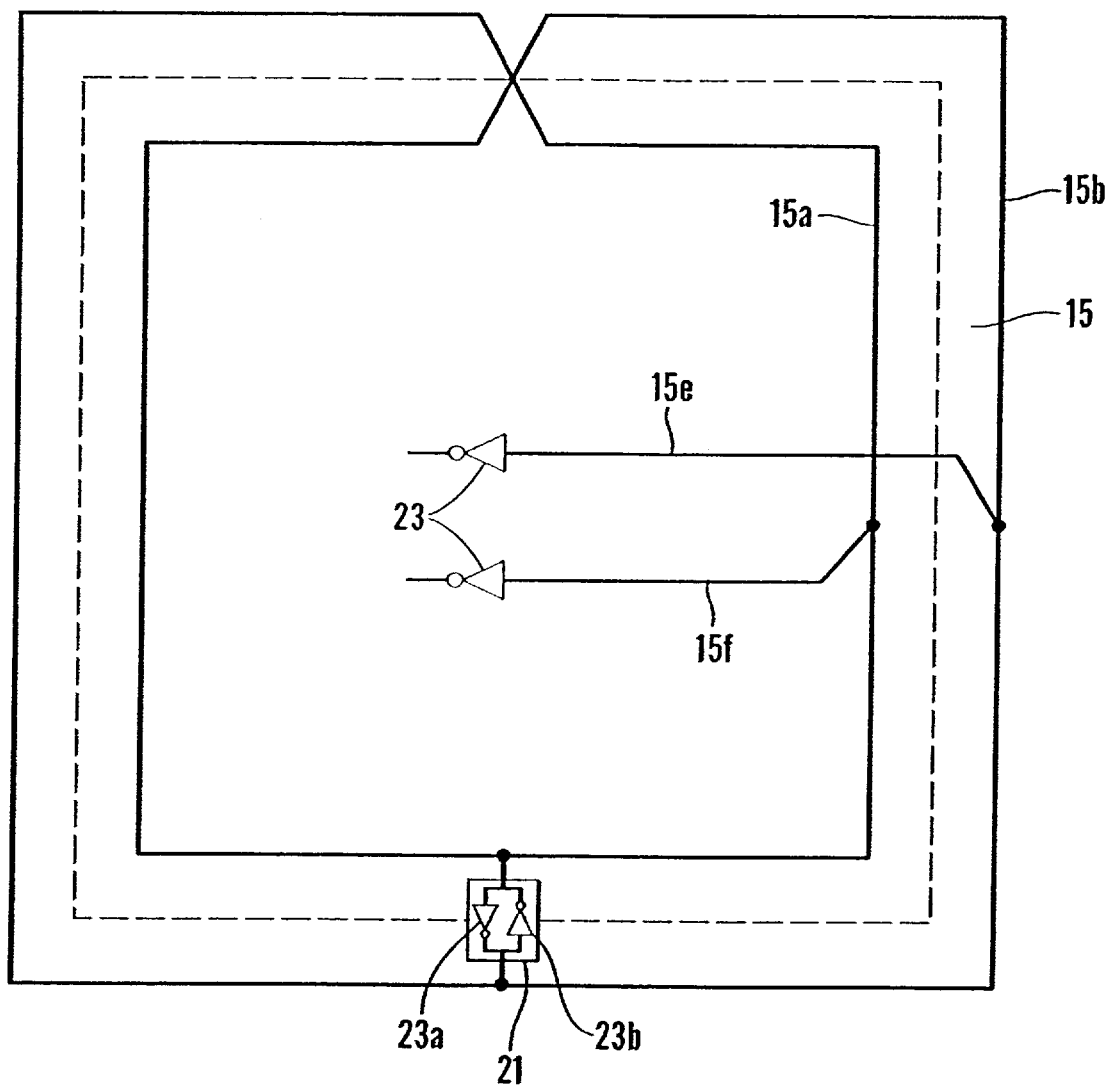
FIG. 30 shows an open-ended transmission-line connection.

FIG. 30 shows addition of an open-ended passive transmission-line (15e, 15f) connected to the closed-loop transmission-line 15 and having the characteristics, of having an electrical length of 180°, of producing no adverse effect at the tap point, since it acts as an open-circuit oscillating stub. Amplifiers 21 will not be present along this open-ended line 15e,f but inverters 23 could be far ends of each of the traces 15c and 15d to reduce risk of spurious oscillations. Indeed, tuned oscillation in such stubs 15e,f can have useful regenerative effects for the transmission-line 15 and thus serve for reinforcement and/or stability purposes.

Passive transmission-line connections with no particular requirement for impedance matching can be used to connect oscillating transmission-lines of the same, or substantially the same, frequency together, at least provided that enough inter-connections are established between two systems, at connection positions with the same relative phases in the inter-connected networks. Such connections can assist in synchronising high speed digital signals between IC's and systems because non-clock signals (i.e. the IC/system data lines) will have similar delay characteristics if they are incorporated into the same routing (e.g. ribbon cable, twisted pair, transmission-line) as the clock connections, thus making data and clocking coherent between different systems.

Figure 31:
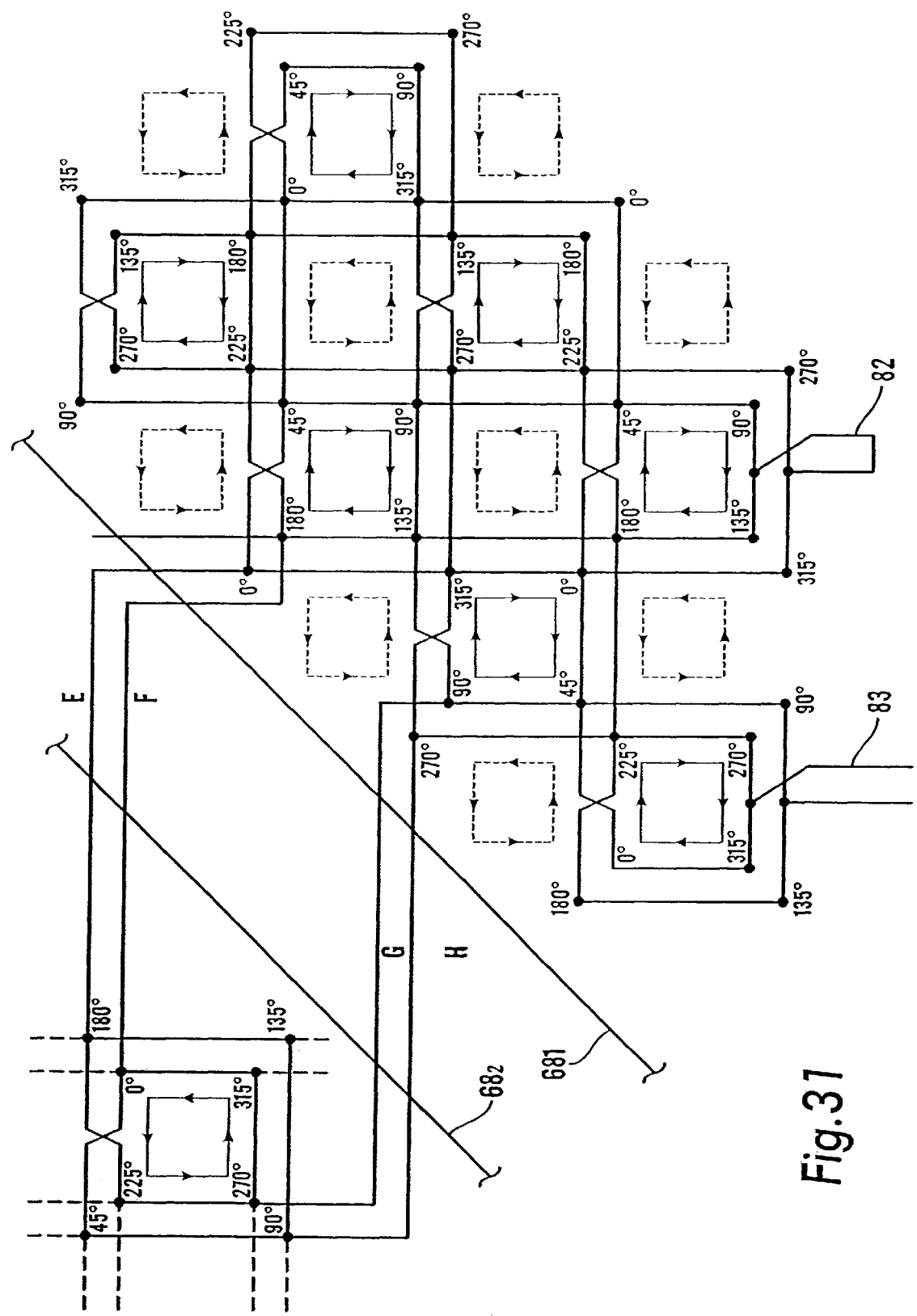
FIG. 31 shows digitally selectable shunt capacitors of Mosfet type.

FIG. 31 shows one example of coherent frequency and phase operation of two clock distribution networks of two monolithic ICs $68_1$, $68_2$ each having a clock generation and distribution hereof and pairs of inter-IC connections E, F and G, H. The two ICs concerned will operate coherently, i.e. at the same frequency and with the same phase relationships, where each of the connections is substantially of 180-degrees electrical lengths, or a multiple satisfying 360°·n+180° where n is zero or an integer.

A single pair of inter-IC connections (E, F or G, H) will result in frequency and phase 'locking'. More than one pair of inter-IC connections (E, F and G, H as shown) will result further in clock wave direction or rotation locking.

Also shown in FIG. 31 is a first and second 'stub' connections 82 and 83, though there could be more of either or each. The first stub connection 82 has a total electrical length of 180° to assist in stabilising operation. The second stub connection 83 is open-ended and also of 180° electrical length and helpful for stabilisation. Such stubs 82, 83 can be particularly useful for non-IC applications of the invention where conductive trace definition may be less precise than for ICs.

Impedance of the pairs of connections E, F and G, H and connections 82, 83 can have any value since, in normal operation and once these connections are energised, there will be no net power flow therein for correct phasing thereof. It is, however, preferred that the impedance of these connections E, F and G, H and 82, 83 is greater than that of oscillator transmission-lines 15 to which they are connected. These connections will support a standing EM wave rather than a travelling EM wave.

Such FIG. 31 inter-connections can be applied equally well to intra-IC, inter-IC, IC-to-PCB and/or any non-IC, i.e. PCB-to-PCB system connections.

Figure 32:
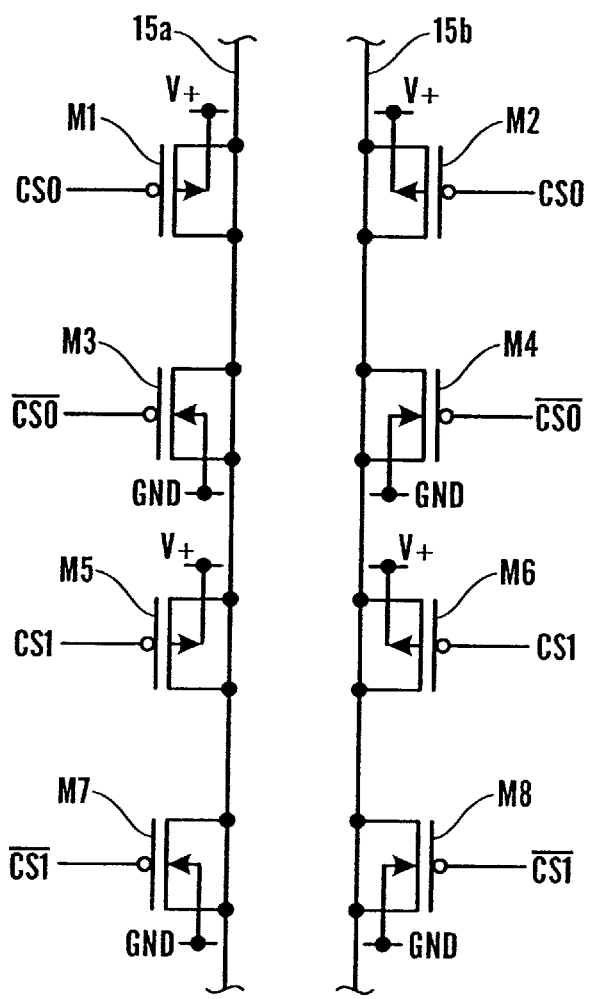
FIG. 32 shows capacitive loading and routing data and/or power across a transmission-line.

FIG. 32 illustrates digitally selectable shunt capacitors that are formed out of mosfet transistors.

Digitally selectable shunt capacitors illustrated in FIG. 32 can be operatively connected to the transmission-line 15 and controlled for the travelling EM wave to be delayed slightly, i.e. the frequency of oscillation can be controlled. Such delays are useful for fine tuning the frequency of a transmission-line(s). As shown, eight shunt capacitors are implemented by means of mosfet transistors. The mosfets transistors M1, M2, M5 and M6 are PMOS transistors and mosfet transistors M3, M4, M7 and M8 are NMOS transistors.

The mosfets M1, M3, M5 and M7 have their drain and source terminals connected to the 'inner' transmission-line conductor 15a, for example, and the mosfets M2, M4, M6 and M8 have their drain and source terminals connected to the 'outer' transmission-line conductor 15b. The substrate terminals of mosfets M1, M2, M5 and M6 are connected to the positive supply rail V+ and the substrate terminals of mosfets M3, M4, M7 and M8 are connected to the negative supply rail GND.

The gate terminals of mosfets M1 and M2 are connected together and controlled by a control signal CS0 and the gate terminals of mosfets M3 and M4 are connected together and controlled by the inverse of control signal CS0. Likewise, the gate terminals of mosfets M5 and M6 are connected together and controlled by a control signal CS1 and the gate terminals of mosfets M7 and M8 are connected together and controlled by the inverse of control signal CS1.

The following truth table illustrates which mosfet shunt capacitors (M1–M8) contribute capacitance, i.e. 'Mosfets On', to the transmission-line 15.

| CS0 | CS1 | Mosfets 'On' | Mosfets 'Off' |
|---|---|---|---|
| 0 | 0 | M1–M8 | — |
| 0 | 1 | M1–M4 | M5–M8 |
| 1 | 0 | M5–M8 | M1–M4 |
| 1 | 1 | — | M1–M8 |

It is preferred that the respective sizes and numbers of shunt capacitors connected to the 'inner' and 'outter' transmission-line conductive traces 15a, 15b are the same, i.e. balanced. Whilst eight mosfet shunt capacitors M1–M8 are shown, any number of mosfet shunt capacitors having suitavle sizes, and hence capacitances, can be used, provided that the transmission-line 15 is balanced, as per FIG. 32.

There are other configurations for producing digitally controllable shunt capacitors that, may or may not be formed using mosfet transistors. One known example, again using mosfets, could be the use of binary weighted mosfet capacitors for example. Alternatives to MOS capacitors affording variable capacitance include varactors and P/N diodes for example.

It can be advantageous for the 'capacitor arrays' to be replicated at regular intervals around the transmission-line (s) so as to distribute the impedance.

Figure 33:
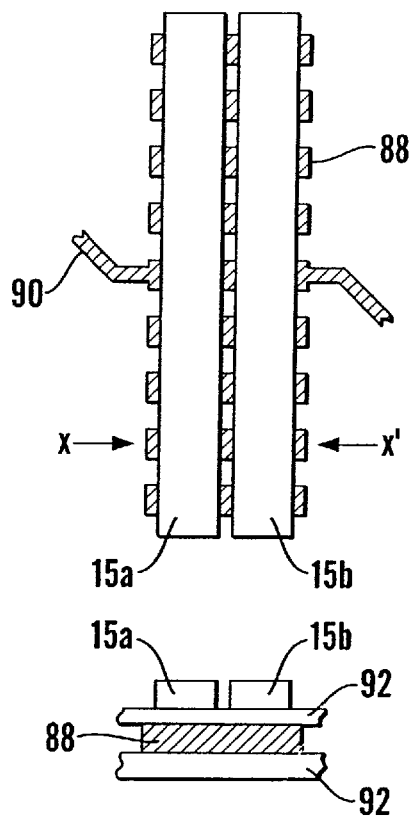
FIG. 33 concerns co-ordinating frequency and phase for two IC's.

FIG. 33 shows how to route data and/or power across a transmission-line 15 and for altering its capacitive loading by way of formations 88 resembling railway sleepers deposited, preferably at regular intervals below the conductive traces 15a, 15b. Alternatively, formations such as 88 could be deposited above and/or below the transmission-lines conductive traces 15a, 15b. As can be seen from the cross sectional view, the traces 15a, 15b are preferably on a metal layer that is isolated from the formation 88 e.g. by a silicon dioxide 92 layer. These formations 88 have the effect of increasing the transmission-lines capacitance and can therefore be used to alter the transmission-line impedance thus the velocity of the travelling EM wave. These formations 88 cam also be used to route data and/or power 99. One advantage of routing data and/or power 99, as illustrated, is that since the clock signals Φ1, Φ2 on the transmission-line 15 are differential, these clock signals Φ1, Φ2 have no effect upon the routed data and/or power signals.

The bi-directional switches (21) using inverters 23a, 23b inherently act as synchronous rectifiers of the clock frequency as can be deduced by the ohmic path from these inverters most negative supply rail to GND and their most positive supply rail to V+. Therefore, the NMOS and PMOS transistors that constitute the back-to-back inverters 23a and 23b (see FIG. 22b) will always be switched by an incident EM wave on the transmission-line 15 to a state where the two 'on' transistors (an NMOS and PMOS respectively) will connect the most negative transmission-line conductive trace to the local GND supply for an NMOS transistor and the local V+ supply for a PMOS transistor. The two NMOS/ PMOS pairs of transistors alternate as the incident EM wave signal polarity reverses for oscillation in the manner of bridge rectification that is synchronous and exemplifies the bi-directionality of the DC-AC-DC conversion mode involved. The transmission-line 15 is thus able to extract and redirect power bi-directionally to supply power to the transmission-line 15 when the local supply rail voltage is greater than the transmission-line voltage and to remove power when the local supply rail voltage is less than the transmission-line voltage, and the transmission-line 15 acts as a power conductor in this mode, see following table:

| Inputs | PMOS 'on' | NMOS 'on' | P/NMOS 'off' |
|---|---|---|---|
| 15a = GND | P1 (15b connected | N2 (15a connected | N1, P2 |
| 15b = V+ | to local V+) | to local GND) | |
| 15a = V+ | P2 (15a connected | N1 (15b connected | N2, P1 |
| 15b = GND | to local V+) | to local GND) | |

This power recycling is particularly appropriate to IC process technologies where the gate length is less than approximately 0.1 microns when the parallel 'on-resistance' will be comparable to the series DC resistance of the supply connections. Such synchronous rectification can act as the basis of power distribution in the absence or impossibility of power supply routing to certain area's of an IC, particularly can be used for 'charge pump' circuitry, i.e. DC-to-DC power conversion. There is also inherent capability for converting DC-to AC power conversion and visa versa. Alternatively, of course, known 'on-chip' transformers could be employed.

The possibility is envisaged of achieving highest possible operating frequencies consistent with disconnectable switching of logic circuitry, including as semiconductor fabrication technology is bound to develop.

Indeed, transmission-line formations themselves should scale with IC process technology, thus smaller and faster transistor formations lead naturally to shorter and faster transmission-line oscillators for yet higher clock frequencies.

Other possibilities include maintaining low power consumption; regardless of applications, which could be as to any resonating of capacitive and inductive connections to a transmission-line, and specifically use relative to such as shift registers or 'precharge'/'evaluate' logic.

Whilst there is evident advantage in not having to use external timing reference such as a quartz crystal, nor PLL techniques, there may be situations and applications where this invention is applied in conjunction with such external timing crystals etc.

Whilst detailing herein has been within the context of currently dominant CMOS technology for ICs, it will be appreciated by those skilled in the art that principles are involved that are also applicable to other semiconductor technologies, e.g. Silicon-Germanium (Si—Ge), Gallium-Arsenide (Ga—As) etc.

Highly beneficial particular utility in overcoming the problems associated with high frequency clocking, e.g. where F>1 GHz, no other applicability of combined timing signal generation and distribution is to be excluded from intended scope hereof, say for systems and apparatus to operate at frequencies less than 1 GHz.

Figure 34A:
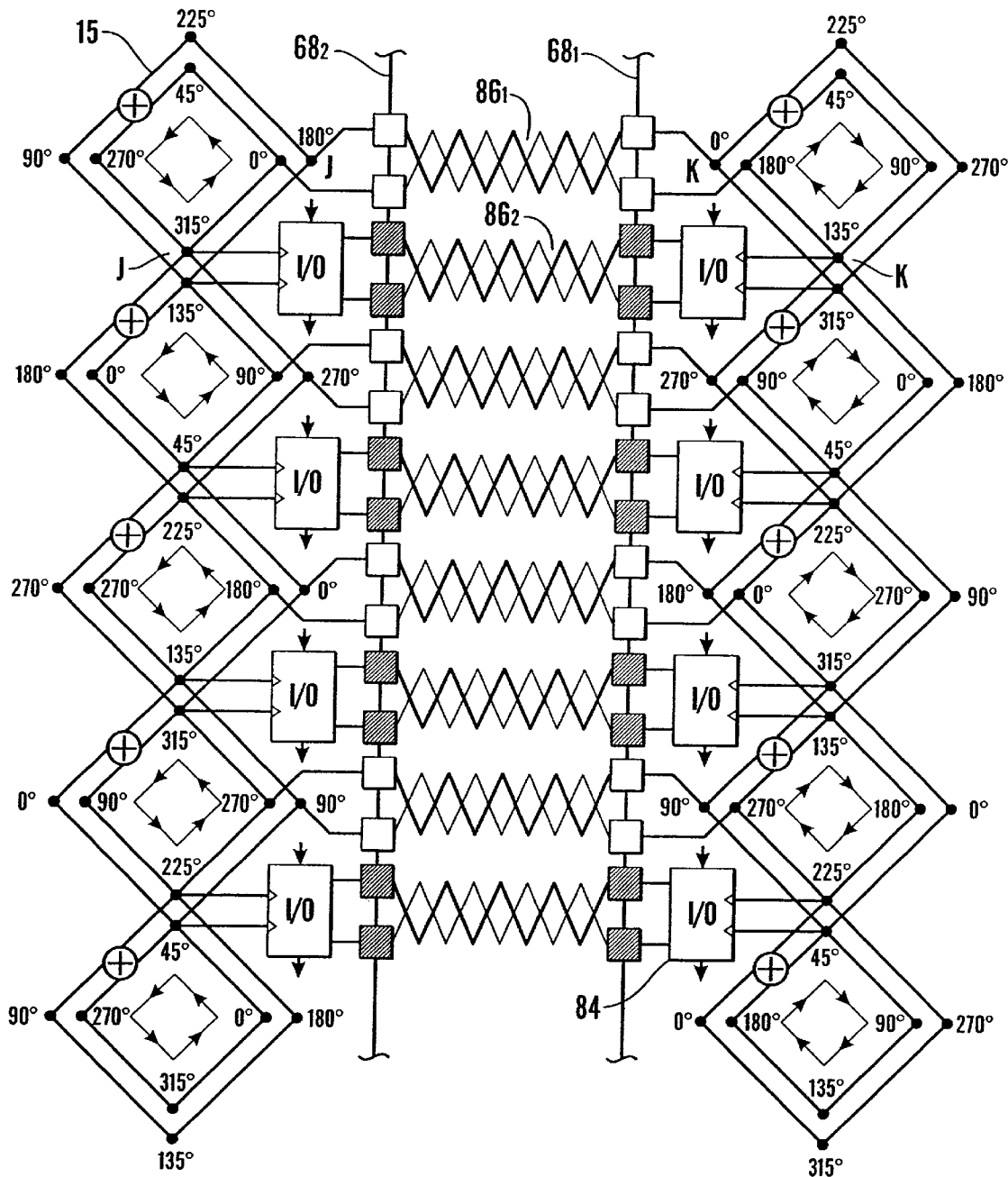
FIG. 34a concerns data transfer embodying this invention for frequency and phase co-ordinated IC's.

FIG. 34a shows two interconnected monolithic IC's $68_1$, $68_2$ that are phase and rotation locked and that further have a plurality of bidirectional data latches 84 and links 86 between them inventively affording separate data processing system connection to act as one coherent structure as to phasing and further as to data transfer. Interconnection positions on the transmission-lines 15 concerned here substantially, a 180° phase difference between ends J, K of each line inter-IC connection, though there is usually a tolerance of at least 1°. The plurality of inter-IC connections 86 can be of 'twisted pair' nature connected between corresponding transmission-lines 15 of both IC's 681, 682. Impedances of these inter-IC connections 86 are again preferably higher than that associated with the clock generation transmission-lines 15.

It is not necessary for there to be equal numbers of clock/phase and data connections. Moreover, the data and clock transmission mediums 86 are of the same length and electrically matched, so both exhibit the same propagation delays, which is advantageous. The nominal 180° phase difference represents a half clock cycle, i.e. Tp, so a data pulse transmitted from either IC to the other by the rising edge of the clock waveform Φ1, will be received during, or just after, the rising edge of the clock waveform Φ2.

Figure 34B:
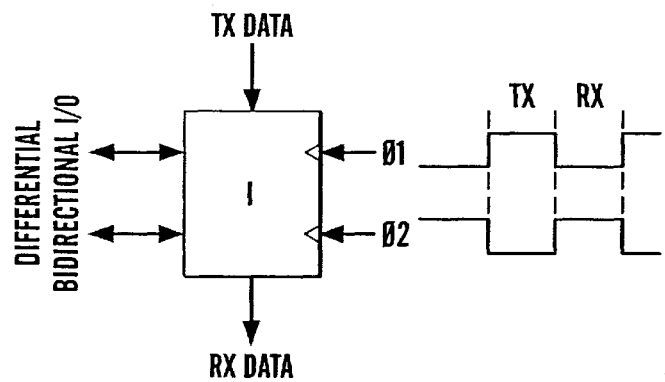

FIG. 34b shows the preferred inventive data latch 84 of FIG. 34a as a block. The data latch 84 is edge triggered by the differential clock signals Φ1 and Φ2 for transmission (TX) and receiving (RX); and has differential bidirectional input/output lines, data pulse control lines labelled TX Data and RX Data, and the clock signal waveforms Φ1 and Φ2.

Techniques hereof greatly facilitate communicating data latches 84 on different IC's $68_1$, $68_2$ being clocked with the same relative phasing. Moreover, FIG. 34a indicates that respective communicating pairs of latches 84 are triggered on different phases, which results in wholly advantageous multi-phase data transfer that eliminates need for simultaneous switching of the transmission-lines 86, thus results in reduction of 'ground bounce' and positive supply voltage dips.

In half duplex data transfer wherein, two data bits are transferred, one each way, during each clock cycle. For data transfer (TX) from one IC to the other, and for local logic control where Φ=1, Φ2=0 and logic 1=V+ and logic 0=GND, the corresponding latches 84 a transmit a single bit of data for the period where Φ1=1, one data bit going from IC $68_1$ to IC $68_2$, and another data bit going from IC $68_2$ to IC $68_1$ in each half cycle. The data signals pass each other on the transmission-line 86, and do not interfere in the twisted pair nature of the transmission-line 86. The last received data signal is usable in this half cycle.

When Φ1 and Φ2 are 180° from going high and low, respectively, data is received and the local logic states are Φ1=0, Φ2=1. The same latches 84 at each of the two IC's now both receive a single bit of data that was sent during the previous half cycle, when Φ2=1.

Figure 34C:
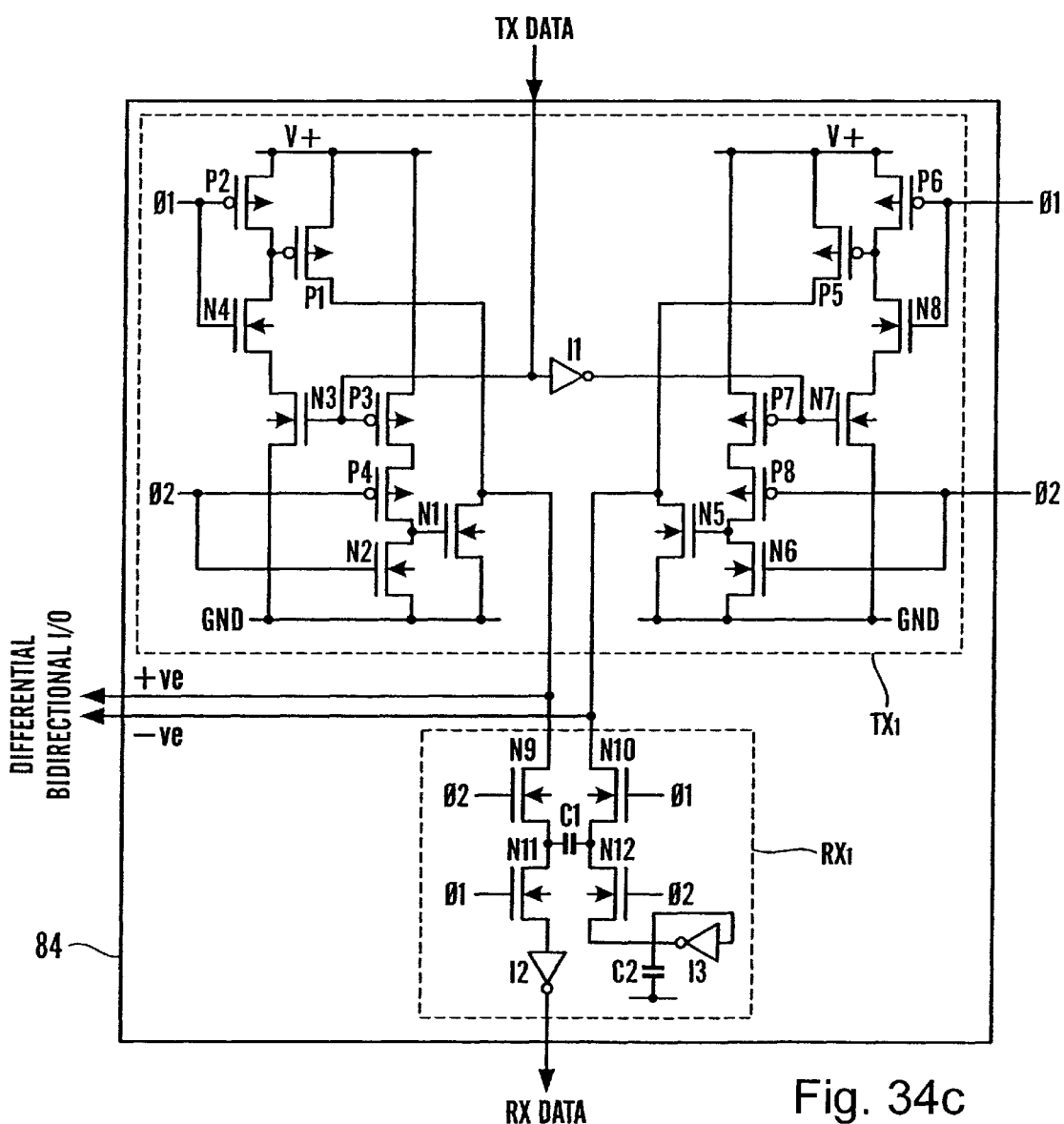

FIG. 34c shows a circuit to implement the data latch 84. Transistors P1, N1, P5 and N5 are operatively arranged and controlled to produce the differential output signals and are only active, i.e. switched 'on', when Φ1=1. Either P1 and N5 turn on for a positive differential output signal, or P5 and N1 turn on for a negative differential output signal. Transistors N4, P4, N8 and P8 are operatively arranged and controlled to allow transistors P1, N1, P5 and N5 to switch 'on' only when Φ1=1, i.e. during the transmit time. Transistors P2, N2, P6 and N6 are operatively arranged and controlled to switch 'off' the output transistors P1, N1, P5 and N5 when Φ2=1, i.e. during the receive time.

Transistor N3 is operatively arranged and controlled by the TX Data control signal for its associated differential bidirectional output to go positive, i.e. V+, via transistors N4 and P1, when the TX Data control signal is a logic 1. Transistor P3 is operatively arranged and controlled by the TX Data control signal for its associated differential bidirectional output to go negative, i.e. GND, via transistors P4 and N1, when the TX Data control signal is a logic 0. The inverter 11 is operatively arranged and controlled such that it produces the inverse logic state of the TX Data control signal.

Transistor N7 is operatively arranged and controlled by the TX Data control signal for its associated differential bidirectional output to go positive, via transistors N8 and P5, when the TX Data control signal is a logic 0. Transistor P7 is operatively arranged and controlled by the TX Data control signal for its associated differential bidirectional output to go negative, via transistors P8 and N5, when the TX Data control signal is a logic 1.

Transistor N13 is operatively arranged and controlled to terminate the differential transmission-line 86 correctly during the receipt (RX) of a data signal. Transistor T13 has an operative "on-resistance" that approximately equals the characteristic impedance of the transmission-line 86.

Transistors N1–8 and P1–8 together with inverter 11 constitute the transmit circuitry TX1 of the bidirectional latch 84.

Transistors N9 and N10 are operatively arranged and controlled to 'sample' for a whole half cycle, onto capacitor C1, the differential signal during the receipt (RX) of a data signal. Transistors N11 and N12 are operatively arranged and controlled to switch the stored charge sample of capacitor C1 onto the operatively arranged and controlled differential-to-single ended converter. This differential-to-single ended converter is made up by the operatively arranged and controlled inverters 12, 13 and capacitor C2. Inverter 13 and capacitor C3 are operatively arranged as a voltage reference and inverter 12 is operatively arranged and controlled such that it acts as a single ended logic output buffer/amplifier for the sampled received (RX'd) data signal.

Transistors N9–N11 and inverters 12 and 13 together with capacitors C1 and C2 constitute the receiving circuitry RX1 of the bidirectional latch 84.

The following is a truth table that summarises the operation of the data latch 84 during the transmit (T) and receipt (RX) of data signals.

| TX Data | Φ1 | Φ2 | +ve Differential Output | −ve Differential Output |
|---|---|---|---|---|
| 0 | 0 | 1 | Hi-Z (receiving) | Hi-Z (receiving) |
| 0 | 1 | 0 | 0 | 1 |
| 1 | 0 | 1 | Hi-Z (receiving) | Hi-Z (receiving) |
| 1 | 1 | 0 | 1 | 0 |

It is noted that, for data link transmission-lines 86 with (360°·n+180°) electrical length there is an additional n cycle latency (delay), but subsequent data is received once per cycle. Furthermore, the phasing could be slightly different from different 180° for TX and RX circuitry within the I/O data latch 84 circuit so as to improve the timing and therefore 'hold times' etc on the data latches 84 and therefore compensate somewhat for switching delays.

The circuit diagram illustrated in FIG. 34c does not include additional waveshaping circuitry that may well be required in practice, but could be of well-known nature.

With clean differential waveshapes, package inductance problems are minimised since GND and V+ package connection currents do not arise through the output switching action of the transmission-lines 86 since, the return currents are via the opposite signal of the differential pair and not through the supply pins. The matching of the package impedance to the transmission-lines 86 is therefore easier.

Figure 34D:
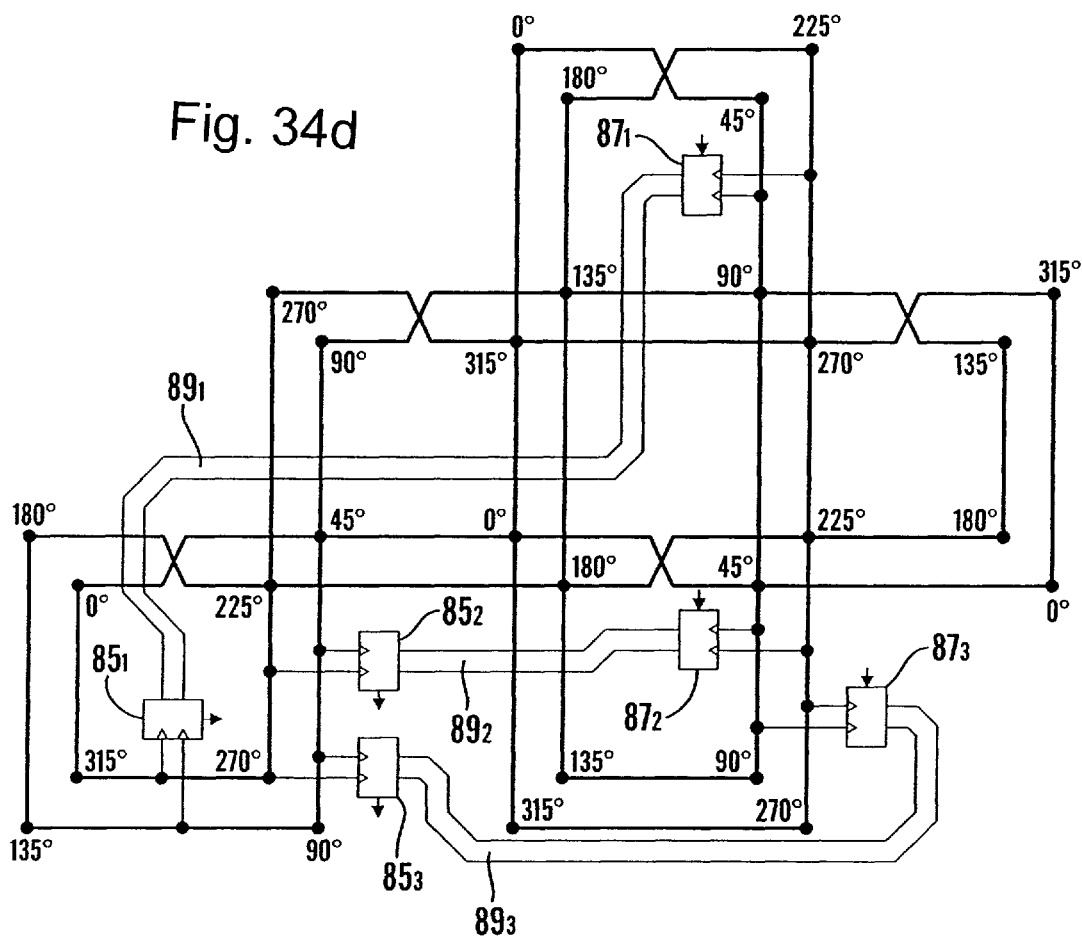

FIG. 34d shows an intra-connected IC having plural unidirectional receive and transmit data latches, see 85 and 87. A first pair of unidirectional transmit and receive latches $87_1$, $85_1$ are operatively connected to two different transmission-lines for operatively transmitting data from one transmission-line to the other. The first receive latch $85_1$ has a 'delay correction through placement' of 45°: where 45° represents the electrical length of respective clock signal connections to the latches $87_1$, $85_1$.

Two pairs of unidirectional transmit/receive latches $85_2$, $87_2$ and $85_3$, $87_3$ operate in the same manner as $87_1$ and $85_1$ except that their delay correction through placement is approximately 10°, which represents the electrical length of their clock signal connections.

Figure 34E:
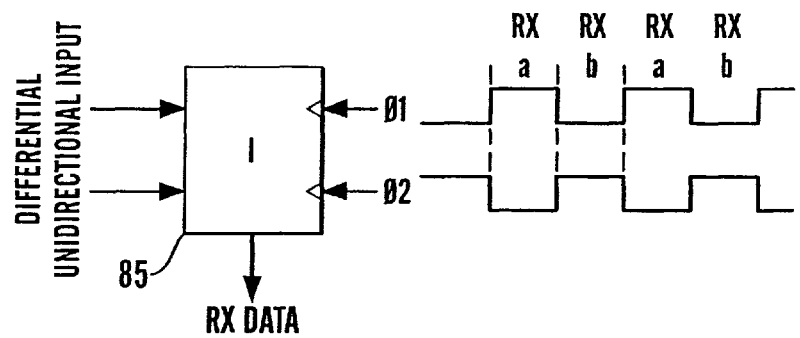
Figure 34E:
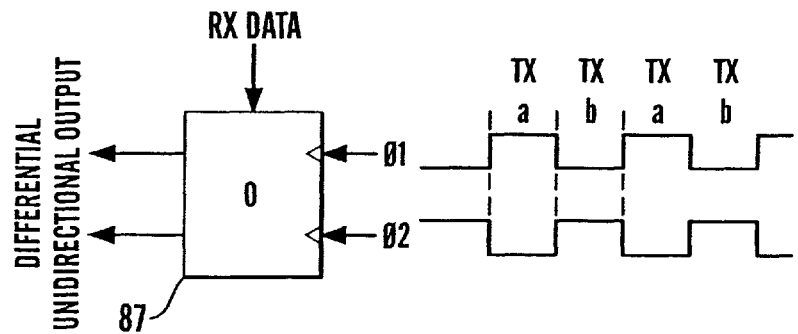

FIG. 34e shows unidirectional transmit and receive latches 85, 87 able to transmit and receive two bits of data per clock cycle if these latches 87, 85 respectively comprise two co-phase transmit or receive circuits respectively TX1 and RX1, as opposed to each having a transmit and receive circuitry TX1 and RX1.

What is claimed is:

1. Electronic circuitry having two circuitry parts each having timing signal generating and distribution means using signal path provisions exhibiting endless electromagnetic continuity affording signal phase inversion with associated regenerative active means so as to serve as source of said timing signals, further comprising inter-connection between the signal path provisions of each of the circuitry parts over an electrical length and at positions of the signal path provisions to coordinate mutual frequency and phase coherence of the circuitry parts, and bidirectional data transfer means at each circuitry part further coordinated with the coordinated timing signals.

2. Electronic circuitry according to claim 1, wherein the inter-connection has an electrical length substantially the same as those of the of the signal path provisions or an odd multiple thereof.

3. Electronic circuitry according to claim 1, wherein the interconnected said positions in one and the other of the circuitry parts have a phase difference corresponding to the electrical length of their said signal paths.

4. Electronic circuitry according to claim 2, wherein the interconnected said positions in one and the other of the circuitry parts have a phase difference corresponding to the electrical length of their said signal paths.

5. Electronic circuitry according to claim 1, wherein a second different circuitry part inter-connection serves further to prescribe directions of travelling said timing signals along their said signal paths.

6. Electronic circuitry according to claim 2, wherein a second different circuitry part inter-connection serves further to prescribe directions of travelling said timing signals along their said signal paths.

7. Electronic circuitry according to claim 3, wherein a second different circuitry part inter-connection serves further to prescribe directions of travelling said timing signals along their said signal paths.

8. Electronic circuitry according to claim 4, wherein a second different circuitry part inter-connection serves further to prescribe directions of travelling said timing signals along their said signal paths.

9. Electronic circuitry according to claim 1, wherein the circuitry parts are of different ICs.

10. Electronic circuitry according to claim 2, wherein the circuitry parts are of different ICs.

11. Electronic circuitry according to claim 3, wherein the circuitry parts are of different ICs.

12. Electronic circuitry according to claim 4, wherein the circuitry parts are of different ICs.

13. Electronic circuitry according to claim 5, wherein the circuitry parts are of different ICs.

14. Electronic circuitry according to claim 6, wherein the circuitry parts are of different ICs.

15. Electronic circuitry according to claim 7, wherein the circuitry parts are of different ICs.

16. Electronic circuitry according to claim 8, wherein the circuitry parts are of different ICs.

17. Electronic circuitry according to claim 1, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

18. Electronic circuitry according to claim 2, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

19. Electronic circuitry according to claim 3, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

20. Electronic circuitry according to claim 4, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

21. Electronic circuitry according to claim 5, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

22. Electronic circuitry according to claim 6, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

23. Electronic circuitry according to claim 7, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

24. Electronic circuitry according to claim 8, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

25. Electronic circuitry according to claim 9, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

26. Electronic circuitry according to claim 10, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

27. Electronic circuitry according to claim 11, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

28. Electronic circuitry according to claim 12, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

29. Electronic circuitry according to claim 13, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

30. Electronic circuitry according to claim 14, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

31. Electronic circuitry according to claim 15, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

32. Electronic circuitry according to claim 16, wherein the data transfer means comprises bidirectional data latches controlled by two-phase differential bipolar said coordinated timing signals so as each to transmit a data bit to the other during the same half cycle of the timing signals and both to receive those data bits in the next half cycle of the timing signals.

33. Electronic circuitry according to claim 17, comprising twisted pair said connections.

34. Electronic circuitry according to claim 18, comprising twisted pair said connections.

35. Electronic circuitry according to claim 19, comprising twisted pair said connections.

36. Electronic circuitry according to claim 20, comprising twisted pair said connections.

37. Electronic circuitry according to claim 21, comprising twisted pair said connections.

38. Electronic circuitry according to claim 22, comprising twisted pair said connections.

39. Electronic circuitry according to claim 23, comprising twisted pair said connections.

40. Electronic circuitry according to claim 24, comprising twisted pair said connections.

41. Electronic circuitry according to claim 25, comprising twisted pair said connections.

42. Electronic circuitry according to claim 26, comprising twisted pair said connections.

43. Electronic circuitry according to claim 27, comprising twisted pair said connections.

44. Electronic circuitry according to claim 28, comprising twisted pair said connections.

45. Electronic circuitry according to claim 29, comprising twisted pair said connections.

46. Electronic circuitry according to claim 30, comprising twisted pair said connections.

47. Electronic circuitry according to claim 31, comprising twisted pair said connections.

48. Electronic circuitry according to claim 32, comprising twisted pair said connections.

* * * * *